(12) United States Patent
Chirania et al.

(10) Patent No.: US 7,116,131 B1
(45) Date of Patent: Oct. 3, 2006

(54) HIGH PERFORMANCE PROGRAMMABLE LOGIC DEVICES UTILIZING DYNAMIC CIRCUITRY

(75) Inventors: Manoj Chirania, Palo Alto, CA (US); Venu M. Kondapalli, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 91 days.

(21) Appl. No.: 10/941,607

(22) Filed: Sep. 15, 2004

(51) Int. Cl.
*H03K 19/177* (2006.01)

(52) U.S. Cl. .......................... 326/41; 326/38; 326/113; 326/93

(58) Field of Classification Search ................ 326/41, 326/47, 101
See application file for complete search history.

(56) References Cited

U.S. PATENT DOCUMENTS

| | | | |
|---|---|---|---|
| 4,740,721 A | 4/1988 | Chung et al. | |
| 4,812,685 A | 3/1989 | Anceau | |
| 5,440,182 A | 8/1995 | Dobbelaere | |
| 5,596,743 A | 1/1997 | Bhat et al. | |
| 5,914,616 A | 6/1999 | Young et al. | |
| 5,952,846 A * | 9/1999 | Silver | 326/41 |
| 6,150,838 A | 11/2000 | Wittig et al. | |
| 6,229,338 B1 | 5/2001 | Coulman et al. | |
| 6,285,218 B1 | 9/2001 | Dhong et al. | |
| 6,433,581 B1 | 8/2002 | Song | |
| 6,614,258 B1 | 9/2003 | Song | |
| 6,768,338 B1 * | 7/2004 | Young et al. | 326/44 |
| 6,992,505 B1 * | 1/2006 | Zhou | 326/41 |

* cited by examiner

*Primary Examiner*—Vibol Tan
(74) *Attorney, Agent, or Firm*—Lois D. Cartier

(57) ABSTRACT

A programmable logic device (PLD) includes dynamic lookup table (LUT) circuits, an interconnect structure implemented in either dynamic or static logic, and optional static logic circuits. Each dynamic LUT circuit has paired true and complement input terminals and provides to the interconnect structure both true and complement output signals precharged to a first known value. In some embodiments, the LUT circuits are self-resetting circuits that detect when the paired input signals are valid and evaluate the LUT output values at that time. Once a valid LUT output value has been produced, the LUT resets itself in anticipation of the next valid input condition. In some embodiments, the LUT circuits are implemented using clocked dynamic logic. Routing multiplexers in the interconnect structure can be static or dynamic logic, optionally skewed. Clocked LUTs and routing multiplexers use either of two clock phases under the control of configuration memory cells of the PLD.

96 Claims, 14 Drawing Sheets

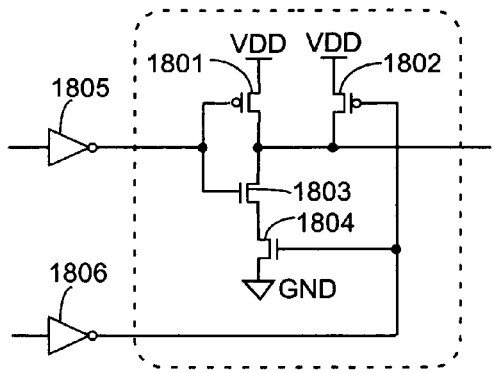
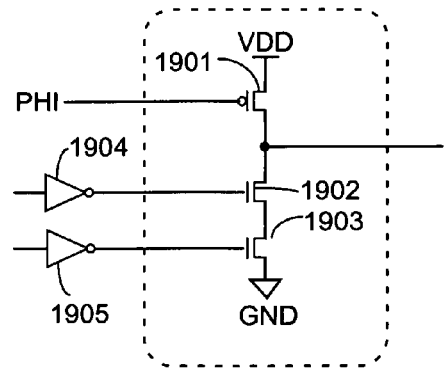
FIG. 18          FIG. 19
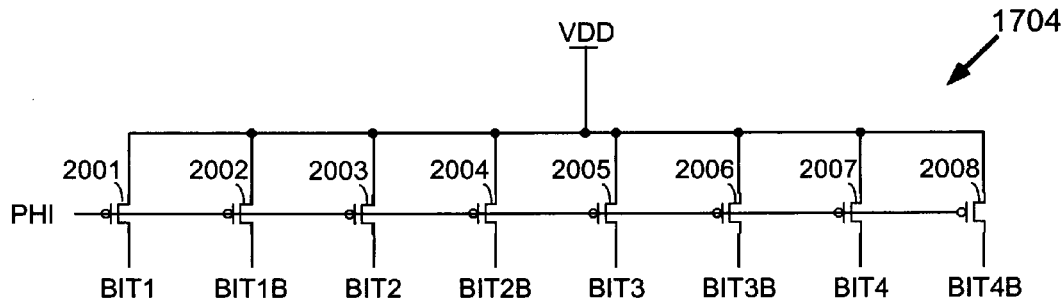
FIG. 20
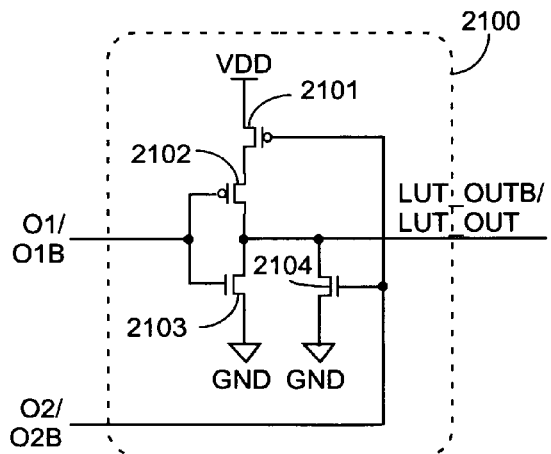
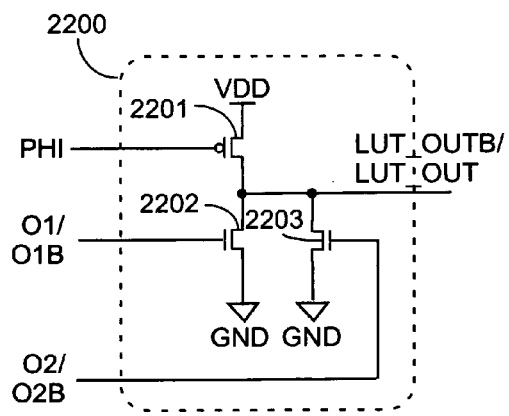
FIG. 21          FIG. 22

HIGH PERFORMANCE PROGRAMMABLE LOGIC DEVICES UTILIZING DYNAMIC CIRCUITRY

FIELD OF THE INVENTION

The invention relates to programmable logic devices (PLDs). More particularly, the invention relates to a PLD that utilizes dynamic logic to obtain high performance.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

FIG. 1 is a simplified illustration of an exemplary FPGA. The FPGA of FIG. 1 includes an array of configurable logic blocks (LBs 101a–101i) and programmable input/output blocks (I/Os 102a–102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

FIG. 2 illustrates in simplified form a configurable logic element (CLE) for an FPGA. CLE 200 of FIG. 2 includes four similar slices SLICE_0–SLICE_3. Each slice includes two lookup tables (LUTs) 201 and 202, a write control circuit 205, two multiplexers MUX1 and MUX2, and two output memory elements 203 and 204. The lookup tables, write control circuit, multiplexers, and output memory elements are all controlled by configuration memory cells M1–M7. Note that at least some of configuration memory cells M1–M7 represent more than one memory cell. Additional configuration memory cells and logic elements are omitted from FIG. 2, for clarity.

Each LUT 201, 202 can function in any of several modes. When in lookup table mode, each LUT has four data input signals IN1–IN4 that are supplied by the FPGA interconnect structure (not shown) via input multiplexers (not shown). (In the present specification, the same reference characters are used to refer to terminals, signal lines, and their corresponding signals.) When in RAM mode, input data is supplied by an input terminal RAM_DI_1, RAM_DI_2 to the DI terminal of the associated LUT. RAM write operations in both LUTs are controlled by write control circuit 205, which supplies one or more write control signals W to both LUTs based on RAM control signals provided by the interconnect structure.

Each LUT 201, 202 provides a LUT output signal to an associated multiplexer MUX1, MUX2, which selects between the LUT output signal and an associated register direct input signal Reg_DI_1, Reg_DI_2 from the interconnect structure. Thus, each LUT can be optionally bypassed. The output of each multiplexer MUX1, MUX2 is provided to the data input terminal D of an associated output memory element (203, 204 respectively). Memory elements 203 and 204 are clocked by a clock signal CK (e.g., provided by a global clock network) and controlled by various other register control signals (e.g., from the interconnect structure or provided by configuration memory cells of the FPGA). Each memory element 203, 204 provides a registered output signal Q1, Q2. The output of each LUT 201, 202 is also provided to an output terminal OUT1, OUT2 of the CLE. Thus, each output memory element can be optionally bypassed. The slice also includes output multiplexers (not shown) that select from among the various output signals of the slice and provide the selected signals to the FPGA interconnect structure. These output multiplexers are also controlled by configuration memory cells (not shown).

One programmable element commonly found in FPGA logic blocks is the lookup table, or LUT. A LUT is a memory array (e.g., a 16×1 array) addressable by a number of input signals (e.g., four input signals). By programming predetermined values into the memory array, the LUT can implement any function of the input variables. While 4-input LUTs are common, LUTs having more or fewer input signals can also be implemented that will accommodate larger or smaller logic functions.

FIG. 3 illustrates in simplified form a well known 4-input lookup table (LUT) for a PLD. The lookup table is implemented as a four-stage 16-to-1 multiplexer. The four input signals A1–A4 together select one of 16 values stored in memory cells MC-0 through MC-15. Thus, the lookup table can implement any function of up to four input signals.

The four input signals A1–A4 are independent signals, each driving one stage of the multiplexer. Inverted versions A1B–A4B of signals A1–A4 are generated by inverters 401–404, respectively. Sixteen configuration memory cells MC-0 through MC-15 drive sixteen corresponding inverters 310–325, each of which drives a corresponding CMOS pass gate 330–345. In a first stage of the multiplexer, paired pass gates 330–331 form a 2-to-1 multiplexer controlled by signals A1 and A1B, which multiplexer drives a CMOS pass gate 346. Pass gates 332–345 are also paired in a similar fashion to form similar 2-to-1 multiplexers driving associated pass gates 347–353. In a second stage of the multiplexer, paired pass gates 346–347 form a 2-to-1 multiplexer controlled by signals A2 and A2B, which multiplexer drives an inverter 305. Similarly, pass gates 348–353 are paired to form similar 2-to-1 multiplexers driving associated inverters 306–308.

In a third stage of the multiplexer, driven by inverters 305–308, pass gates 354–355 are paired to form a 2-to-1 multiplexer controlled by signals A3 and A3B and driving a CMOS pass gate 358. Similarly, pass gates 356–357 are paired to form a similar 2-to-1 multiplexer driving a CMOS pass gate 359. In a fourth stage of the multiplexer, pass gates 358–359 are paired to form a 2-to-1 multiplexer controlled by signals A4 and A4B and driving an inverter 309. Inverter 309 provides the LUT output signal OUT.

FIG. 4 illustrates a known configuration memory cell and pass gates controlled by the configuration memory cell. A configuration memory cell typically includes two cross-coupled logic gates, such as the two inverters formed by P-channel transistor 401 and N-channel transistor 403, and by P-channel transistor 402 and N-channel transistor 404. The output nodes of the two cross-coupled logic gates are referred to herein as "storage nodes". The storage node of the first inverter is node Q. In FIG. 4, node Q drives pass gates 407. Pass gates 407 can be, for example, part of a routing multiplexer, lookup table, user storage element (e.g., block RAM or any other type of memory available for the storage of user data), or other configurable logic element. In some configuration memory cells, node QB, the storage node of the second inverter, drives the pass gates. In some configuration memory cells, both storage nodes Q and QB are used to drive logic external to the cell.

An N-channel transistor 405 is coupled between node Q and a first bit line BIT, and gated by a word line WORD. Another N-channel transistor 406 is coupled between node QB and a second bit line BITB, which carries an inverse value from the first bit line. Transistor 406 is also gated by word line WORD. Bit lines BIT and BITB are used to carry values written to the configuration memory cell, and also to read values from the configuration memory cell, e.g., during a configuration readback procedure. Variations on the circuit of FIG. 4 are also well known, e.g., two word lines can be provided, or only one bit line can be included. The circuit of FIG. 4 is a representative example of the various well-known memory cell configurations.

A PLD interconnect structure can be complex and highly flexible. For example, Young et al. describe the interconnect structure of an exemplary FPGA in U.S. Pat. No. 5,914,616, issued Jun. 22, 1999 and entitled "FPGA Repeatable Interconnect Structure with Hierarchical Interconnect Lines", which is incorporated herein by reference in its entirety.

As described above, programmable interconnect points (PIPs) are often coupled into groups (e.g., group 105 of FIG. 1) that implement multiplexer circuits selecting one of several interconnect lines to provide a signal to a destination interconnect line or logic block. A routing multiplexer can be implemented, for example, as shown in FIG. 5. The illustrated circuit selects one of several different input signals and passes the selected signal to an output terminal. Note that FIG. 5 illustrates a routing multiplexer with eight inputs, but PLD routing multiplexers typically have many more inputs, e.g., 28, 30, or 32. However, FIG. 5 illustrates a smaller circuit, for clarity.

The circuit of FIG. 5 includes eight input terminals IN0—IN7 and ten pass gates 500–509. Pass gates 500–503 selectively pass input signals IN0—IN3, respectively, to a first internal node INT1. Each pass gate 500–503 has a gate terminal driven by a configuration memory cell M12–M15, respectively. Similarly, pass gates 504–507 selectively pass input signals IN4—IN7, respectively, to a second internal node INT2. Each pass gate 504–507 has a gate terminal driven by one of the same configuration memory cells M12–M15, respectively. From internal nodes INT1, INT2, pass gates 508, 509 are controlled by configuration memory cells M10, M11, respectively, to selectively pass at most one signal to a third internal node INT3.

The signal on internal node INT3 is buffered by buffer BUF to provide output signal ROUT. Buffer BUF includes two inverters 511, 512 coupled in series, and a pullup (e.g., a P-channel transistor 513 to power high VDD) on internal node INT3 and driven by the node between the two inverters.

Values stored in configuration memory cells M10–M15 select at most one of the input signals IN0–IN7 to be passed to internal node INT3, and hence to output node ROUT. If none of the input signals is selected, output signal ROUT is held at its initial high value by pullup 513.

Clearly, a circuit implemented in flexible programmable logic such as that shown in FIGS. 1–5 can potentially be slower than circuitry implemented using dedicated logic (i.e., logic designed for a specific purpose). For example, a circuit implemented using LUTs and flip-flops might need to traverse a succession of LUTs and interconnections between each pair of successive flip-flops, as shown in FIG. 6. The exemplary signal path illustrated in FIG. 6 connects an output terminal of flip-flop 601 with an input terminal of flip-flop 609, and sequentially traverses interconnect 602, LUT 603, interconnect 604, LUT 605, interconnect 606, interconnect 607, and LUT 608. The path delay includes one clock-to-out delay for flip-flop 601, four interconnect delays, three LUT delays, and one setup time for flip-flop 609. The total of these delays determines the minimum clock period for the illustrated signal path.

In non-programmable circuits, one known method of increasing circuit performance is the use of dynamic logic. In dynamic circuitry, many or all nodes (e.g., all output nodes) are pre-charged to a first known value. This state is referred to herein as the "pre-charge state". At a later time the circuit enters the "evaluation state", in which the pre-charge is released and some of the pre-charged nodes change to a second known value, as determined by the logic. In clocked dynamic logic, for example, all nodes can be pulled high at a falling edge of a clock, and then some of the nodes are selectively pulled low at the rising edge of the clock. Therefore, whenever the clock is low the circuit is in the pre-charge state, and whenever the clock is high the circuit is in the evaluation state. (Clearly, dynamic circuits also can be designed to operate in the opposite fashion, i.e., to be in the pre-charge state whenever the clock is high, and in the evaluation state whenever the clock is low.) Thus, only the falling edge on the pre-charged nodes is speed-critical, and circuitry can be skewed for a fast falling edge and a slow rising edge on these nodes. Another type of known dynamic logic uses a self-resetting technique, in which the output node is pre-charged during the pre-charge state, then is conditionally discharged (evaluated) whenever an input node of the circuit changes state. Thus, a low pulse might or might not appear at the output node, based on the values of the various input signals.

The application of dynamic logic principles to PLDs is not straightforward. For example, if dynamic logic is applied to the LUT of FIG. 3, the circuit will not work, because the LUT output signals are non-monotonic. In other words, a LUT output signal can go either high or low (i.e., change state in either direction) depending on the contents of the memory cells, the values of the various input signals, and the relative timing of the input signals. However, LUTs and interconnect are widely used in FPGAs and can consume the largest percentage of the available cycle time in critical timing paths. Therefore, it is desirable to provide LUTs and interconnect circuits that enable the use of dynamic circuitry in PLDs.

SUMMARY OF THE INVENTION

The invention provides a programmable logic device (PLD) that includes dynamic lookup table (LUT) circuits and an interconnect structure programmably interconnecting the dynamic LUT circuits. In some embodiments, the PLD also includes static logic circuits (e.g., static LUT circuits) coupled to the interconnect structure. Each dynamic LUT circuit has paired true and complement input terminals and provides to the interconnect structure both true and complement output signals pre-charged to a first known value (e.g., a high value). In some embodiments, the interconnect structure also includes dynamic logic, e.g., dynamic programmable routing multiplexers. In other embodiments, the routing multiplexers are static. In some embodiments, flip-flops are provided that can be used to interface the logic implemented in the dynamic LUTs with other logic, e.g., with static logic also included in the PLD.

In some embodiments, the LUT circuits are self-resetting circuits that detect when the paired input signals are valid (e.g., when each input signal pair includes one high and one low value) and evaluates the LUT output value at that time. Once a valid LUT output value has been provided (e.g., the paired LUT output signals include one high value and one low value), the LUT resets itself in anticipation of the next valid input condition. The true and complement output signals from the LUTs can be sent through the interconnect structure to another self-resetting LUT in a logic chain. In some of these embodiments, routing multiplexers in the interconnect structure are skewed to pass a change in value from a first known value (e.g., a high value) to a second known value (e.g., a low value) more quickly than a change in value from the second known value to the first known value. In some embodiments, both LUT circuits and the interconnect structure are skewed.

The invention also provides self-resetting LUT circuits and programmable routing multiplexer circuits that can be used to implement the PLDs described above.

In some embodiments, the LUT circuits are implemented using clocked dynamic logic. The PLD includes, for each of these dynamic LUT circuits, a memory cell and a clock multiplexer. The clock multiplexer selects between two clock signals under control of a value stored in the memory cell. Thus, each dynamic LUT circuit can be clocked by either of the two clock signals. In some embodiments, the routing multiplexers are also implemented using dynamic logic. For example, each routing multiplexer can be clocked by either of the same two clock signals as those controlling the dynamic LUT circuits, e.g., using a separate clock multiplexer and memory cell for each routing multiplexer. Therefore, the number of LUT circuits and routing multiplexers traversed between each clock edge can be selectively controlled as dictated by the parameters of the user design being implemented in the PLD. In some of these embodiments, the LUT circuits and/or routing multiplexers are skewed to increase the relative speed of the evaluation state. In some embodiments, the routing multiplexers utilize dynamic self-resetting logic, e.g., similar to that shown herein for the self-resetting LUT circuits.

In some of these embodiments, the PLD is a field programmable gate array (FPGA), and the memory cells are configuration memory cells of the FPGA.

BRIEF DESCRIPTION OF THE DRAWINGS

The present invention is illustrated by way of example, and not by way of limitation, in the following figures.

FIG. 18 illustrates a static NAND circuit that can be used, for example, to implement a decoder circuit for the dynamic LUT circuit of FIG. 17.

FIG. 19 illustrates a dynamic NAND circuit that can be used, for example, to implement the decoder circuit for the dynamic LUT circuit of FIG. 17.

FIG. 20 illustrates an exemplary pre-charge circuit that can be used, for example, in the dynamic LUT circuit of FIG. 17.

FIG. 21 illustrates a static NOR circuit that can be used in a LUT output circuit, for example, in the dynamic LUT circuit of FIG. 17.

FIG. 22 illustrates a dynamic NOR circuit that can be used in a LUT output circuit, for example, in the dynamic LUT circuit of FIG. 17.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

In dynamic logic, both true and complement signals are provided between dynamic logic circuits. Note that in the context of dynamic logic, true and complement signals do not always have opposite values. Instead, both signals are pre-charged to a first known value, which can be either a high value or a low value. In response to some triggering signal, one of the true and complement pre-charged signals then changes to a second and opposite known value. In response to another pre-charge signal, both true and complement signals are then pre-charged once again to the first known value. Note that in the exemplary embodiments illustrated herein, the pre-charge values are high values. However, dynamic PLD circuit output signals can be pre-charged to low values, if desired. The implementation of such circuits will be apparent to those of skill in the art after review of the present specification and drawings.

Dynamic programmable interconnect can generally be made faster than static interconnect, because only one edge is speed-critical. For example, when the pre-charge value is high, the speed at which each true and complement signal goes high is usually not very important. Instead, the speed at which one of the two signals is pulled low determines the overall speed of the signal path. Therefore, the logic can be skewed to make this critical edge significantly faster than the non-critical (pre-charging) edge. Further, the transistors controlling the speed of the non-critical edge can be made smaller, and thus slower, without affecting the overall performance of the circuit. This area savings can compensate at least partially for the additional area consumed by supplying both true and complement signals.

Figure 7:
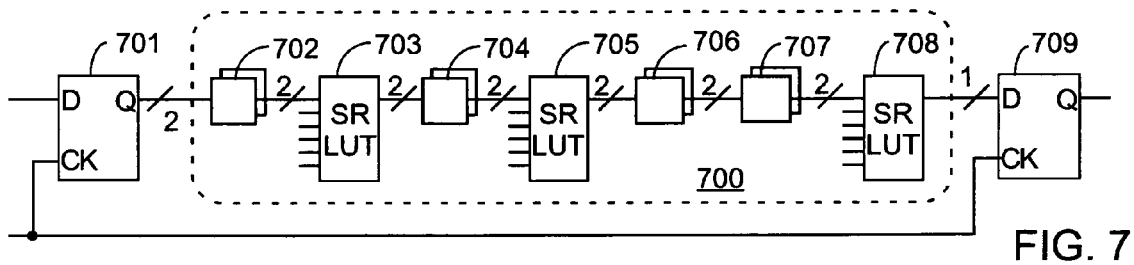
FIG. 7 illustrates an exemplary signal path in a first dynamic PLD.
Figure 8:
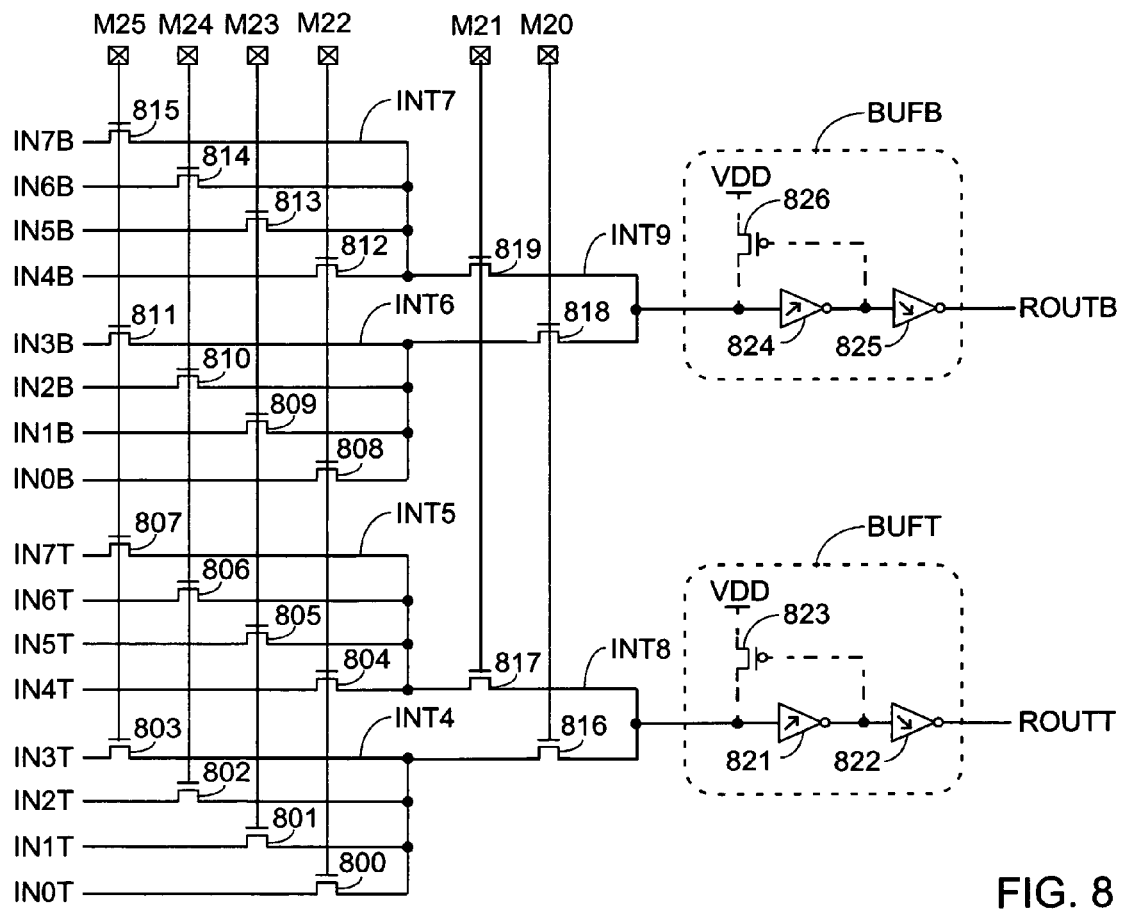
FIG. 8 illustrates an exemplary pair of routing multiplexers that can be used, for example, in the dynamic PLD of FIG. 7.
Figure 12:
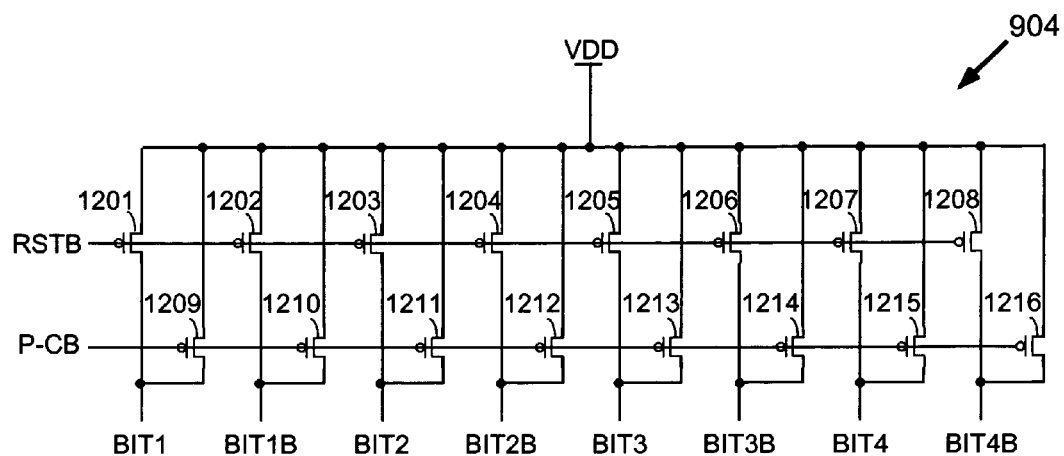
FIG. 12 illustrates an exemplary pre-charge circuit that can be used, for example, in the self-resetting LUT circuit of FIG. 9.
Figure 13:
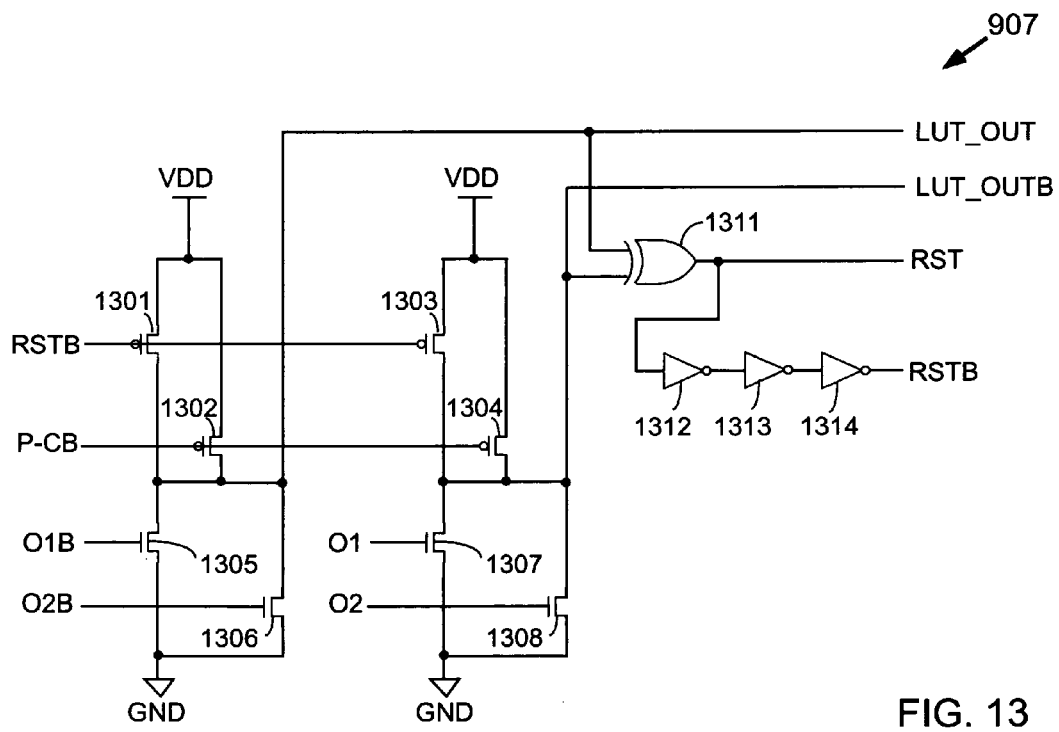
FIG. 13 illustrates an exemplary LUT output circuit that can be used, for example, in the self-resetting LUT circuit of FIG. 9.
Figure 14:
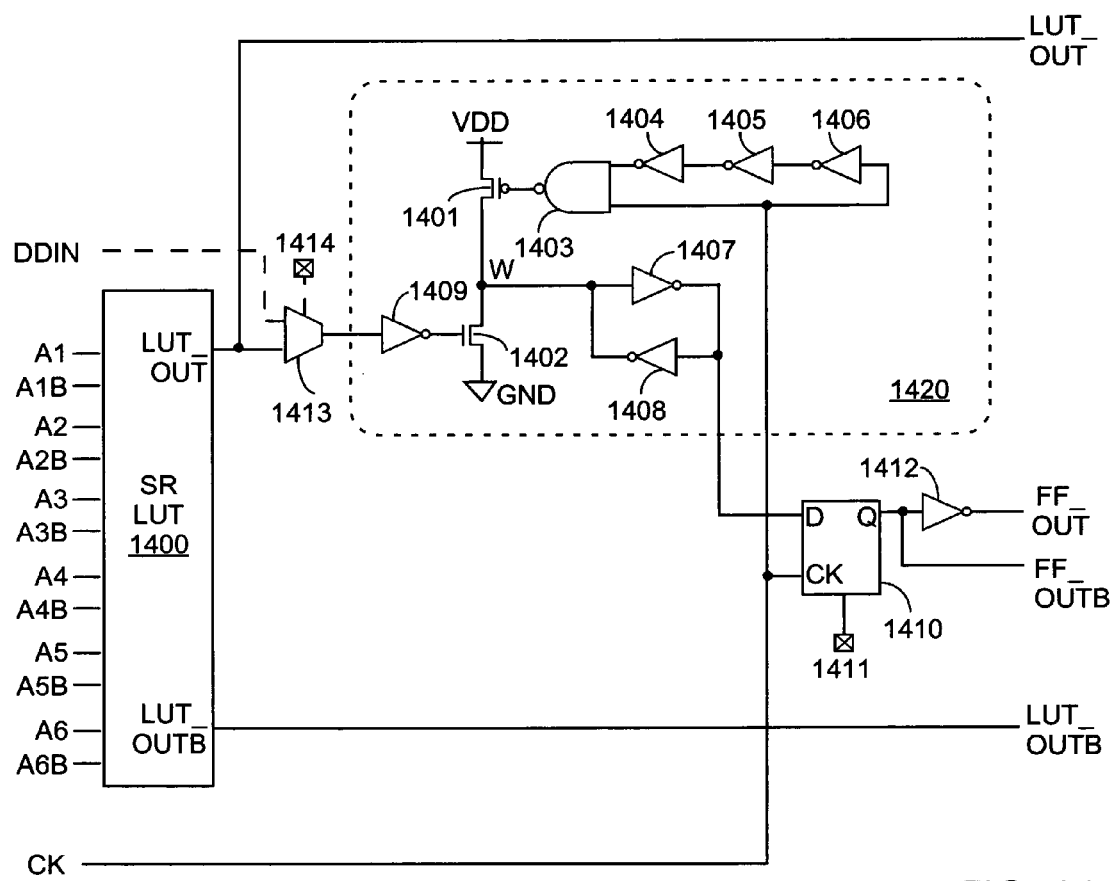
FIG. 14 illustrates an exemplary configurable logic element (CLE) that can include, for example, the self-resetting LUT circuit of FIG. 9.

In a first embodiment, shown in FIGS. 7–14, the LUT circuits are self-resetting LUT circuits implemented using dynamic logic (e.g., LUT circuits "SR LUT" in FIG. 7), while the routing multiplexers are implemented using skewed static logic. Because the dynamic logic is self-resetting, the LUT and routing multiplexer output signals are not clocked. Therefore, a flip-flop is typically inserted before and after a succession of these circuits, as shown in FIG. 7. An exemplary skewed routing multiplexer is shown in FIG. 8. A compatible exemplary self-resetting LUT circuit is shown in FIGS. 9–13. A compatible exemplary flip-flop interface circuit is illustrated in FIG. 14.

FIG. 7 illustrates an exemplary signal path 700 in a first dynamic PLD implemented using self-resetting LUT circuits according to a first embodiment. When dynamic logic is used, two interconnect elements are used to interconnect each LUT circuit, as shown in FIG. 7, because both true and complement signals are provided between dynamic logic circuits. In the illustrated signal path 700, the true and complement signals from flip-flop 701 sequentially traverse interconnect 702 (two elements), LUT circuit 703 (a single LUT circuit receiving both true and complement input signals and providing both true and complement output signals), interconnect 704 (two elements), LUT circuit 705 (a single LUT circuit), interconnect 706 (two elements), interconnect 707 (two elements), and LUT circuit 708 (a single LUT circuit).

Figure 6:
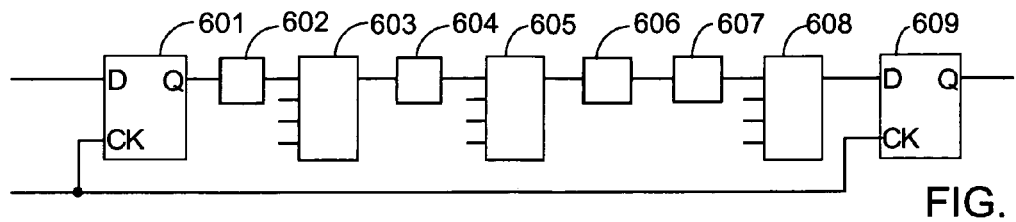
FIG. 6 illustrates an exemplary signal path in a known PLD.

Only one of the true and complement signals need be provided from LUT circuit 708 to flip-flop 709. Nevertheless, signal path 700 uses twice as many interconnect elements than the prior art signal path shown in FIG. 6. However, an advantage of dynamic logic that in some cases can outweigh the increased use of interconnect resources is the increased speed of the signal paths, which can lead to better overall performance of critical paths within a user design, and therefore better overall performance of the design as a whole. Additionally, the overall area required to implement the interconnect resources can be reduced by the use of certain design techniques, as is now described in connection with FIG. 8.

FIG. 8 illustrates a pair of skewed routing multiplexers that can be used, for example, in the dynamic PLD of FIG. 7. FIG. 8 illustrates two routing multiplexers each having eight inputs, but PLD routing multiplexers typically have many more inputs, e.g., 28, 30, or 32. However, FIG. 8 illustrates smaller circuits, for clarity. The implementation of larger routing multiplexers will be apparent to those of skill in the art on reviewing FIG. 8. The illustrated circuit selects two paired true and complement input signals from sixteen paired input signals and passes the two selected signals to paired true and complement output terminals ROUTT and ROUTB.

The circuit of FIG. 8 includes eight true input terminals IN0T–IN7T, eight complement input terminals IN0B–IN7B, and twenty pass gates 800–819. Pass gates 800–803 selectively pass input signals IN0T–IN3T, respectively, to a first internal node INT4. Each pass gate 800–803 has a gate terminal driven by a configuration memory cell M22–M25, respectively. Similarly, pass gates 804–807 selectively pass input signals IN4T–IN7T, respectively, to a second internal node INT5. Each pass gate 804–807 has a gate terminal driven by one of the same configuration memory cells M22–M25, respectively. Pass gates 808–811 selectively pass input signals IN0B–IN3B, respectively, to a third internal node INT6. Each pass gate 808–811 has a gate terminal driven by one of the same configuration memory cells M22–M25, respectively. Pass gates 812–815 selectively pass input signals IN4B–IN7B, respectively, to a fourth internal node INT7. Each pass gate 812–815 has a gate terminal driven by one of the same configuration memory cells M22–M25, respectively.

From internal nodes INT4, INT5, pass gates 816, 817 are controlled by configuration memory cells M20, M21, respectively, to selectively pass at most one signal to a fifth internal node INT8. From internal nodes INT6, INT7, pass gates 818, 819 are controlled by the same configuration memory cells M20, M21, respectively, to selectively pass at most one signal to a sixth internal node INT9.

The signal on internal node INT8 is buffered by buffer BUFT to provide true output signal ROUTT. Buffer BUFT includes two inverters 821, 822 coupled in series, and an optional pullup (e.g., a P-channel transistor 823 to power high VDD) on internal node INT8 and driven by the node between the two inverters. Note that in the pictured embodiment inverter 822 is skewed to provide a faster high-to-low transition, as indicated by the downward arrow in the inverter symbol, and inverter 821 is skewed to provide a faster low-to-high transition, as indicated by the upward arrow in the inverter symbol. Pullup 823 is optional in this embodiment, as indicated by the dashed interconnections to the pullup, because the low-to-high transition on node INT8 is not speed-critical. Thus, the circuit as a whole is skewed to provide a faster falling edge than rising edge on output signal ROUTT.

Similarly, the signal on internal node INT9 is buffered by buffer BUFB to provide complement output signal ROUTB. Buffer BUFB includes two inverters 824, 825 coupled in series, and an optional pullup (e.g., a P-channel transistor 826 to power high VDD) on internal node INT9 and driven by the node between the two inverters. Note that in the pictured embodiment inverter 825 is skewed to provide a fast high-to-low transition, and inverter 824 is skewed to provide a faster low-to-high transition. Pullup 826 is optional in this embodiment, because the low-to-high transition on node INT9 is not speed-critical. Thus, the circuit as a whole is skewed to provide a faster falling edge than rising edge on output signal ROUTB. As is well known, logic can be skewed, for example, by reducing the size of the non-critical transistors. This technique reduces the overall area consumed by the routing multiplexers.

Note that in the pictured embodiment, configuration memory cells M20–M25 are shared between the two paired routing multiplexers illustrated in FIG. 8. Because memory cells consume an appreciable amount of area, this dual use of the memory cells also provides a significant area savings over using two separate sets of memory cells to control two paired routing multiplexers. However, in some embodiments (not shown), each routing multiplexer is controlled by an independent set of memory cells.

Figure 9:
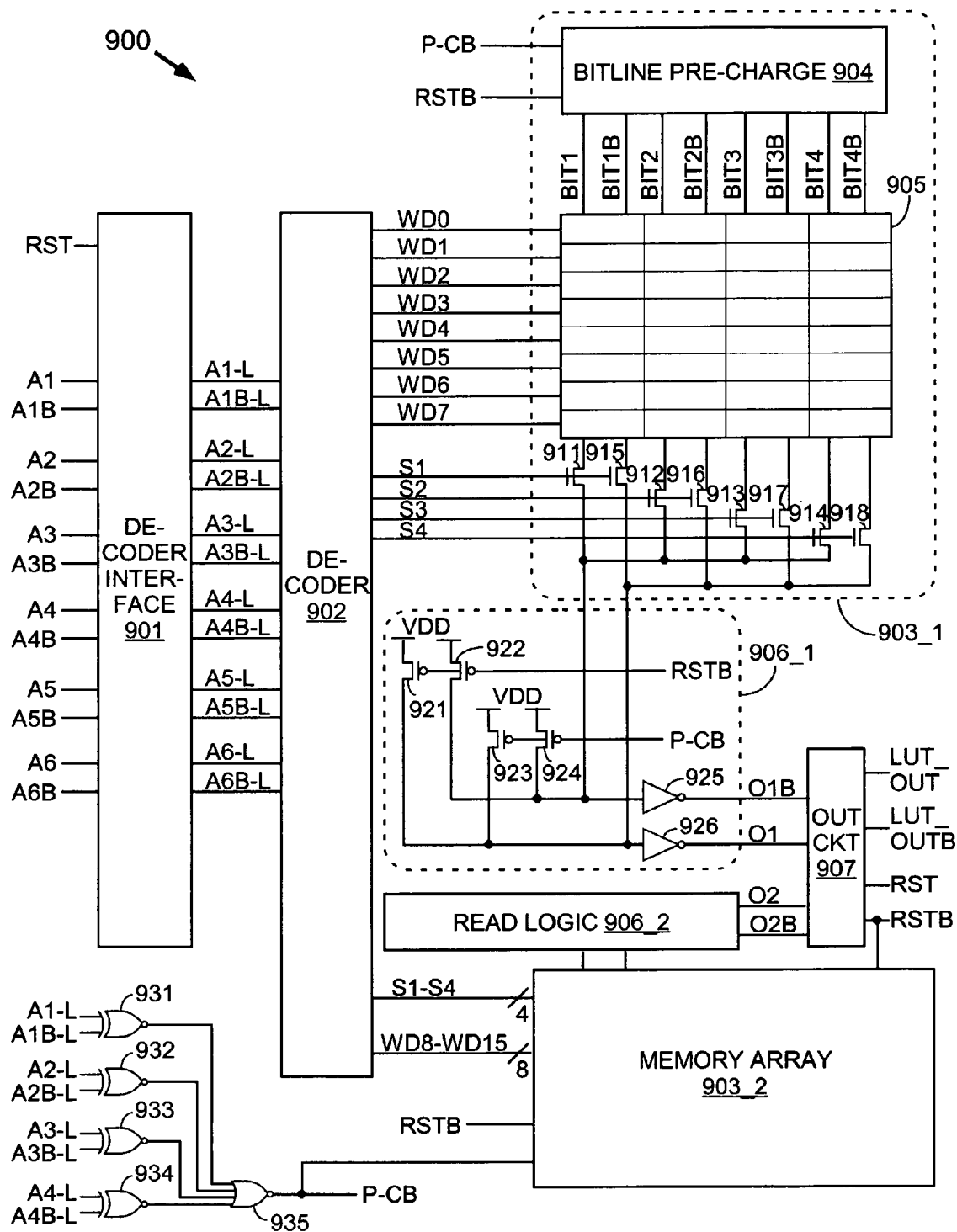
FIG. 9 illustrates a self-resetting LUT circuit that can be used, for example, in the dynamic PLD of FIG. 7.

FIG. 9 illustrates a self-resetting lookup table (LUT) circuit that can be used, for example, in the dynamic PLD of FIG. 7. The circuit of FIG. 9 includes a decoder interface circuit 901, a decoder 902, memory arrays 903_1 and 903_2, read logic circuits 906_1 and 906_2, output circuit 907, and a pre-charge generator circuit comprising exclusive NOR gates 931–934 and NOR gate 935, coupled together as shown in FIG. 9. Memory arrays 903_1, 903_2 each include a bitline pre-charge circuit 904, an array of memory cells 905, and a read multiplexer comprising N-channel transistors 911–918, coupled together as shown in FIG. 9. Read logic circuits 906_1 and 906_2 each include two pullups to power high VDD on each input node, a first pullup 921, 922 gated by reset signal RSTB and a second pullup 923–924 gated by pre-charge signal P-CB. (In some embodiments, these pullups are omitted.) Each input signal is then inverted by an inverter 925, 926 and passed as signals O1, O1B or O2, O2B to the output circuit 907.

The circuit of FIG. 9 functions as follows. The LUT is implemented as an array of memory cells (array 905 and its counterpart array included in element 903_2) and a read multiplexer (elements 911–918 and their counterparts included in element 903_2). The array of memory cells is addressed by word lines (WD0–WD15) derived from four of the six input signal pairs (A1-A1B, A2-A2B, A3-A3B, A4-A4B), and the read multiplexer is addressed by two additional input signal pairs (A5-A5B, A6-A6B). Thus, for example, input signals not on the critical path can be preferentially routed to the first four input terminal pairs (A1-A1B, A2-A2B, A3-A3B, A4-A4B, the "slower" input terminals), while input signals on the critical path can be preferentially routed to the two "faster" input terminal pairs (A5-A5B, A6-A6B).

Decoder 902 decodes the input signals to provide word lines to the memory array. In the illustrated embodiment, the decode path for the faster input signals is shorter (i.e., includes less logic and less delay) than the decode path for the slower input signals. Decoder interface circuit 901 latches all twelve input signals to ensure that the input signals to decoder 902 are all valid at the same time.

In the pre-charge state, all of the input signals A1–A6, A1B–A6B are high. Therefore, the internal pre-charge signal P-CB is low, which pre-charges all of the bitlines BIT1–BIT4, BIT1B–BIT4B high via pre-charge circuit 904. The output signals O1–O2, O1B–O2B from the read multiplexer are also pre-charged, in this embodiment to low values. In the pictured embodiment, the LUT output signals LUT_OUT and LUT_OUTB are pre-charged high.

When all of the input terminal pairs have received their dynamic input values (i.e., each input signal pair has, at least briefly, included one high and one low value), the pre-charge circuit constituting elements 931–935 drives signal P-CB high. Self-resetting LUT circuit 900 enters the evaluation state. The bitlines, read multiplexer outputs, and LUT output signals are no longer pre-charged, and the LUT output signals LUT_OUT and LUT_OUTB are evaluated. In other words, LUT output signals LUT_OUT and LUT_OUTB assume the values dictated by the various latched input signals and by the selected value stored in the memory array.

When one of signals LUT_OUT and LUT_OUTB is high and the other is low, the LUT has provided a valid dynamic signal value. Therefore, this condition is detected in output circuit 907, reset signal RST goes high, and signal RSTB goes low. Signals RST and RSTB return the latches, bitlines, and LUT output signals to their pre-charge condition. Because the bitlines in the memory array are all high again, the two LUT output signals both go high, and the reset signal RST goes low again while signal RSTB goes high. Thus, the LUT circuit of FIG. 9 has evaluated the various input signals and determined that their values are valid, evaluated a result based on the valid values, provided the result at a pair of true and complement output terminals, and reset itself to the pre-charge state to await another set of valid input signals.

Note that in the embodiment of FIG. 9, input signals A5, A5B, A6, and A6B do not contribute to the pre-charge circuit. In the illustrated embodiment, these signals are used only to select one of the values read from the memory array (via signals S1–S4), and increased speed is achieved by entering the evaluation state (i.e., allowing signal P-CB to go high) without waiting for the arrival of these signals. This arrangement does not create a problem with the circuit, because decoder 902 is designed such that none of signals S1–S4 will go high until low values have appeared on two of input signals A5, A5B, A6, and A6B. (See FIG. 11.)

Figure 10:
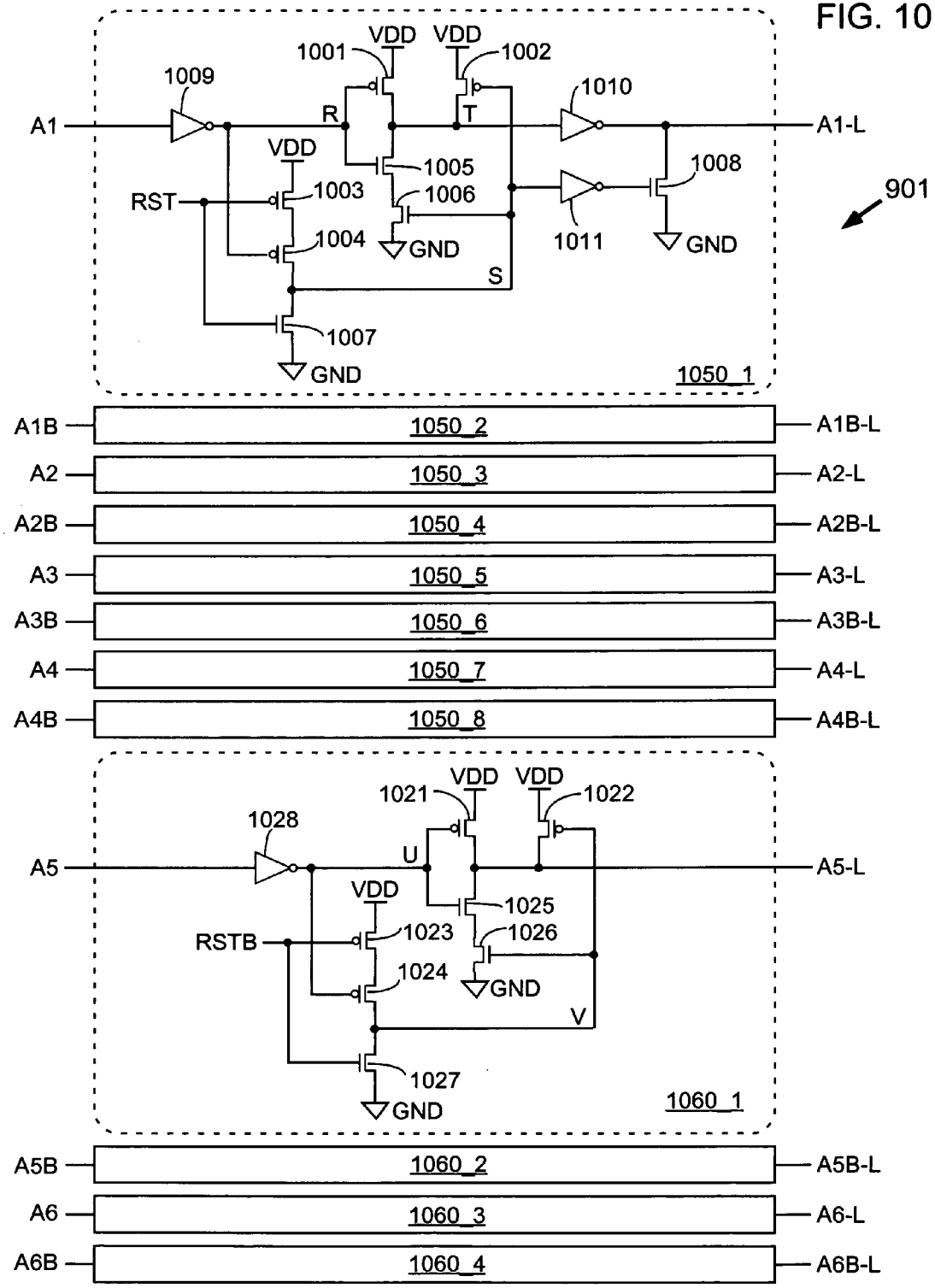
FIG. 10 illustrates an exemplary decoder interface circuit that can be used, for example, in the self-resetting LUT circuit of FIG. 9.
Figure 11:
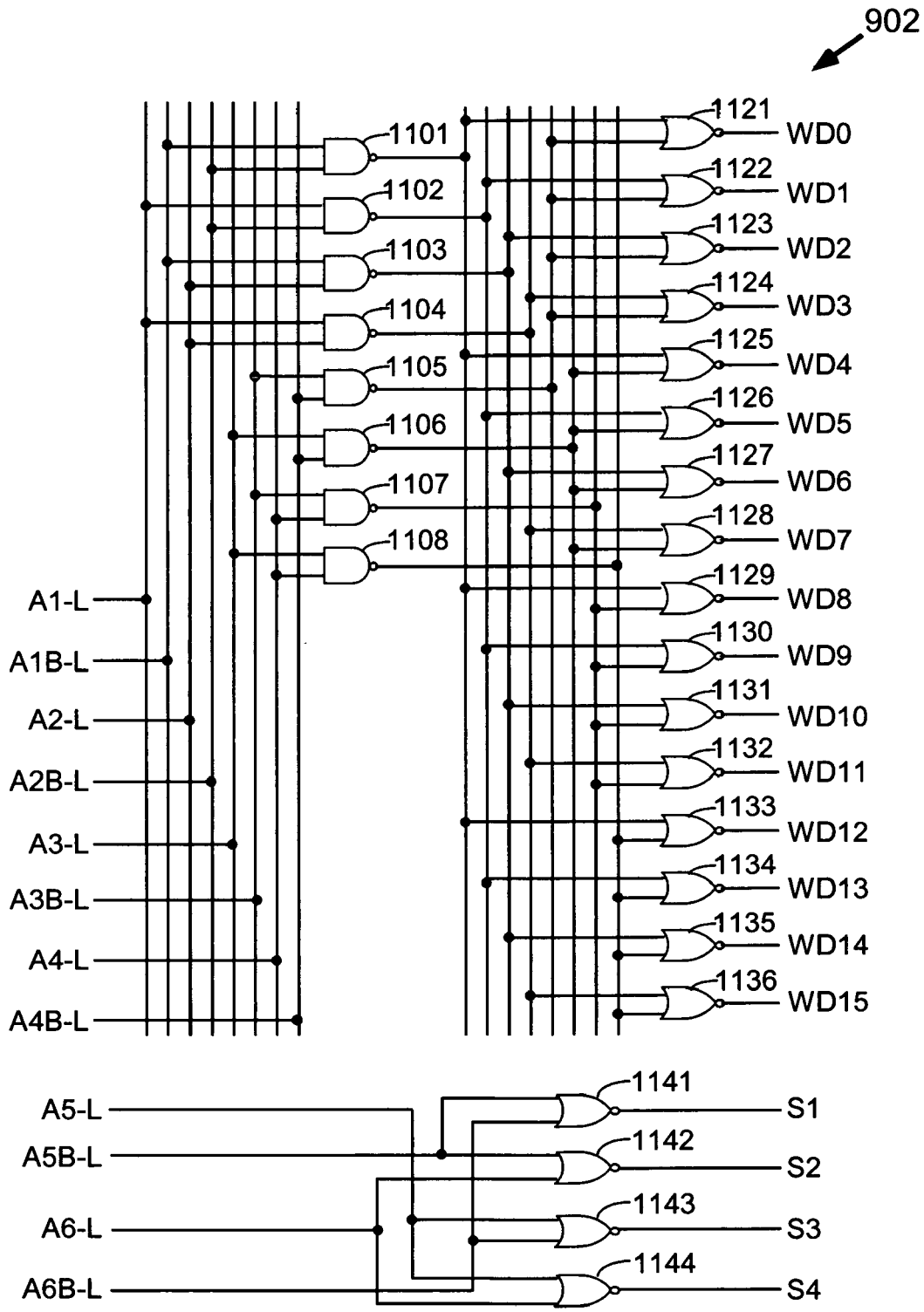
FIG. 11 illustrates an exemplary decoder that can be used, for example, in the self-resetting LUT circuit of FIG. 9.

FIG. 10 illustrates an exemplary decoder interface circuit that can be used, for example, in the self-resetting lookup table circuit of FIG. 9. As described above, decoder interface circuit 901 latches all twelve input signals to ensure that the input signals to decoder 902 are all valid at the same time. Note, however, that the interface circuits (1050_1 through 1050_8) for the eight slower input signals (A1–A4 and A1B–A4B) are slightly different from the interface circuits (1060_1 through 1060_4) for the four faster interface signals (A5–A6 and A5B–A6B). The result of this difference is that the signal path for the slower signals includes one more inversion and takes slightly longer to traverse. This additional inversion compensates for an additional inversion included in the corresponding decoder circuit 902, which is shown in FIG. 11.

Returning now to FIG. 10, each of interface circuits 1050_1 through 1050_8 includes a NAND gate including P-channel transistors 1001–1002 and N-channel transistors 1005–1006, an inverting reset logic gate including P-channel transistors 1003–1004 and N-channel transistor 1007, inverters 1009–1011, and a pulldown including N-channel transistor 1008, coupled together as shown in FIG. 10.

Each interface circuit 1050_n functions as follows. During the pre-charge state, the input signal A1–A4 or A1B–A4B is high. Therefore, node R is low, node T is high, and the corresponding output signal (A1-L through A4-L or A1B-L through A4B-L) is low. Signal RST has already pulsed high at the time that the LUT output signals LUT_OUT and LUT_OUTB assumed different values, as described above in connection with FIG. 9. Therefore, node S has also pulsed low, then returned to a high value when signal RST went low again (pulled high through transistors 1003 and 1004). Thus, when the input signal A1–A4 or A1B–A4B goes low, node R goes high, node T goes low, and the output signal (A1-L through A1B-L or A1B-L through A4B-L) goes high.

Each of interface circuits 1060_1 through 1060_4 includes an inverter 1028, a NAND gate including P-channel transistors 1021–1022 and N-channel transistors 1025–1026, and an inverting reset logic gate including P-channel transistors 1023–1024 and N-channel transistor 1027, coupled together as shown in FIG. 10.

Each interface circuit 1060_n functions as follows. During the pre-charge state, the input signal A5–A6 or A5B–A6B is high. Therefore, node U is low and the corresponding output signal (A5-L, A6-L, A5B-L, or A6B-L) is high. Signal RST has already pulsed high at the time that the LUT output signals LUT_OUT and LUT_OUTB assumed different values, as described above in connection with FIG. 9. Therefore, node V has also pulsed low, then returned to a high value when signal RST went low again (pulled high through transistors 1023 and 1024). Thus, when the input signal A5–A6 or A5B–A6B goes low, node U goes high, and the output signal (A5-L, A6-L, A5B-L, or A6B-L) goes low.

The latched values A1-L through A6-L and A1B-L through A6B-L from decoder interface circuit 901 are passed to decoder 902, which can be implemented, for example, as shown in FIG. 11. Clearly, other decoder implementations can also be used. Exemplary decoder circuit 902 of FIG. 11 includes NAND gates 1101–1108 and NOR gates 1121–1136 and 1141–1144, coupled together as shown in FIG. 11. Note that the slower input signals A1-L through A4-L and A1B-L through A4B-L each pass through two inversions as they are decoded to form wordline signals WD0–WD15, and the faster input signals A5-L, A6-L, A5B-L, and A6B-L each pass through only one inversion as they are decoded to form select signals S1–S4. Thus, decoder circuit 902 is configured and arranged to pass the "faster" input signals more quickly and the "slower" input signals more slowly, relative to one another. (Note that the "slower" input signals are not necessarily slowed down. Instead, the "faster" input signals are preferably accommodated by providing faster signal paths through the decoder circuit.) Combined with the inversions in decoder interface circuit 901, this characteristic of the decoder ensures that during the pre-charge state of the LUT circuit of FIG. 9, no word lines are high in array of memory cells 905 and no bitlines are selected by the read multiplexer in memory array 903_1, 903_2.

FIG. 12 illustrates an exemplary implementation of bitline pre-charge circuit 904 that can be used, for example, in the self-resetting lookup table circuit of FIG. 9. Each bitline BIT1–BIT4 and BIT1B–BIT4B in array of memory cells 905 has a first attached pullup 1201–1208 and a second attached pullup 1209–1216 to power high VDD, implemented in this embodiment as P-channel transistors. The first pullups are gated by signal RSTB, the active-low reset signal from output circuit 907. The second pullups are gated by signal P-CB, which goes low when the self-resetting LUT of FIG. 9 detects valid input values on the four slower input signal pairs.

FIG. 13 illustrates an exemplary implementation of LUT output circuit 907 that can be used, for example, in the self-resetting lookup table circuit of FIG. 9. Output circuit 907 includes P-channel transistors 1301–1304, N-channel transistors 1305–1308, exclusive OR gate 1311, and inverters 1312–1314, coupled together as shown in FIG. 13.

In the embodiment of FIG. 9, the self-resetting LUT circuit includes a memory array divided into two different memory arrays 903_1 and 903_2. This division has the advantage of increasing the overall speed of reading a value from the addressed memory cell. However, one of the two values read from the two halves of the complete array must be selected and used to generate the output signals from the LUT circuit. LUT output circuit 907 performs this function and also generates the self-resetting internal signals RST and RSTB.

Signal LUT_OUT is coupled to two pulldowns 1305, 1306 gated by signals O1B and O2B, respectively, from the two halves of the memory array. Therefore, if either of these signals is high, output signal LUT_OUT is low. Signal LUT_OUTB is coupled to two pulldowns 1307, 1308 gated by signals O1 and O2, respectively, from the two halves of the memory array. Therefore, if either of these signals is high, output signal LUT_OUTB is low. Additionally, each of signals LUT_OUT and LUT_OUTB has a first pullup 1301, 1303 coupled to signal RSTB and a second pullup 1302, 1304 coupled to signal P-CB. Note that only one of the four output values O1, O1B, O2, and O2B will be high in the evaluation state, because all bitlines are pre-charged high and only one pair of true and complement values is read from the entire memory array. Therefore, output signals LUT_OUT and LUT_OUTB are both high during the pre-charge state of the LUT circuit, then exactly one of the two output signals goes low after the pre-charge signal P-CB goes high.

In some embodiments, pullups 1301–1304 are omitted. The pre-charge and reset pullups on the memory cell outputs provide the pre-charge and reset functions for the LUT output signals. However, these pullups can be desirable to increase the speed of operation of the circuit and/or to ensure strong high values at the output terminals of the LUT circuit.

When one of the two output signals LUT_OUT and LUT_OUTB goes low, the other signal remains high and exclusive OR gate 1311 drives signal RST high. Signal RST going high releases the latched values in decoder interface circuit 901. After the delay caused by the three inverters 1312–1314, signal RSTB goes low, pre-charging the bitlines in array of memory cells 905, resetting output signals O1–O2 and O1B–O2B to low values, and resetting both output signals LUT_OUT and LUT_OUTB high. In response to the high values on output signals LUT_OUT and LUT_OUTB, signal RST goes low and signal RSTB goes high. Thus, the LUT circuit is ready to receive the next set of valid input signals.

As has been described, the self-resetting LUT circuit of FIGS. 9–13 provides a pair of true and complementary dynamic output signals. One of the two output signals will pulse low after a valid set of input signals is received by the LUT circuit. Clearly, however, the time at which this output pulse appears depends on the delays that occur through the LUT circuit, in addition to any interconnection delays, and all of these delays can vary based on temperature, operating voltage, and other conditions such as processing variations. Therefore, storing an output signal from the self-resetting LUT circuit in a flip-flop is not a simple matter of providing a clock edge, because the required timing of the clock edge cannot necessarily be predicted accurately.

Therefore, a flip-flop interface circuit is provided that latches the LUT output and allows a valid LUT output value to be clocked into a flip-flop. For example, referring back to FIG. 7, a value from self-resetting LUT circuit 708 can be clocked into flip-flop 709 by utilizing a flip-flop interface circuit. Note that only one of the two LUT output signals (e.g., either signal LUT_OUT or signal LUT_OUTB) need be clocked into the flip-flop.

FIG. 14 illustrates an exemplary configurable logic element (CLE) that can include, for example, the self-resetting lookup table circuit of FIG. 9. The CLE of FIG. 14 includes a self-resetting LUT circuit 1400 (e.g., LUT circuit 900 of FIG. 9), an optional multiplexer 1413 controlled by at least a first configuration memory cell 1414, a flip-flop interface circuit 1420, a flip-flop 1410 controlled by one or more configuration memory cells 1411, and an inverter 1412, coupled together as shown in FIG. 14. Multiplexer 1413 selects either the LUT output signal LUT_OUT or a dynamic direct input signal DDIN (e.g., from the interconnect structure) as the input signal to the flip-flop. Flip-flop interface circuit 1420 latches any low value received from multiplexer 1413 and keeps the value latched until the arrival of the next rising edge of the flip-flop clock signal CK. Therefore, because the pre-charge state of the CLE input signals is high, any low value arriving from the LUT circuit or from the interconnect structure is preserved and stored in the flip-flop.

Flip-flop interface circuit 1420 includes a pullup 1401 (a P-channel transistor) and a pulldown 1402 (an N-channel transistor) on an internal node W, a NAND gate 1403, and six inverters 1404–1409, coupled together as shown in FIG. 14.

Flip-flop interface circuit 1420 functions as follows. During the pre-charge state of the CLE, signals DDIN and LUT_OUT are both high. Therefore, no matter how multiplexer 1413 is configured a high value is passed to inverter 1409, where the signal is inverted to a low value. Therefore, pulldown 1402 is off. At some previous time, signal CK has gone high and caused NAND gate 1403 (which with inverters 1404–1406 implements a rising edge detector) to drive a low value onto pullup 1401. Therefore, signal W is high and data input D of flip-flop 1410 is low. If the low value of D has been clocked into flip-flop 1410, flip-flop output signal FF_OUT is high, and flip-flop output signal FF_OUTB is low.

Assume now that a low signal arrives at multiplexer 1413, either from LUT circuit 1400 or input terminal DDIN, and is passed to inverter 1409. Pulldown 1402 turns on, pulling node W low, and the low value is latched in the latched formed by inverters 1407, 1408. Data input D to flip-flop 1410 goes high, and on the next rising edge of flip-flop clock signal CK, the value stored in flip-flop 1410 goes high, signal FF_OUT goes low, and signal FF_OUTB goes high. Thus, flip-flop interface circuit 1420 has captured the low value and held the value until the next rising edge of the clock signal CK, then stored the value in the flip-flop.

In some embodiments, some or all of the circuits illustrated in FIGS. 7–14 are skewed to increase the speed of the evaluation (e.g., the response to falling edges of the routed signals and the LUT output signals) relative to the speed of the pre-charge (e.g., the response to rising edges of the routed signals and the LUT output signals). This adjustment can be made, for example, in a fashion similar to that illustrated in FIG. 8. By increasing the speed of the evaluation, the overall performance of the circuit is increased. By also decreasing the speed of the pre-charge, some of the transistor sizes can be reduced to help compensate for the increased amount of logic required to implement dynamic circuits as opposed to static circuits. Methods of skewing logic circuitry are well known to those of skill in the relevant arts.

Configurable logic elements in PLDs frequently include additional logic not shown in the various figures herein, such as carry logic, additional multiplexers, and so forth. Examples of these additional logic elements are illustrated, for example, in FIGS. 6A and 6B of U.S. Pat. No. 5,914,616, which is referenced above. In some embodiments, this additional logic is also present in the CLE along with the dynamic LUT circuits described herein. In some embodiments, this additional logic is also implemented in dynamic logic. Well-known techniques can be used.

As noted above, FIGS. 7–14 illustrate the components of a first PLD that utilizes dynamic elements (including a self-resetting LUT circuit) to implement programmable logic. FIGS. 15–22 illustrate a second dynamic PLD that utilizes a different technique. In the embodiment of FIGS. 15–22, both LUT circuits and the interconnect structure are clocked, with the clock for each element being programmable so that the transition between the clocks can be programmably adjusted according to the requirements of the design. In the pictured embodiment two clock signals are utilized, with a first clock signal providing the pre-charge state for a first group of circuits, and a second clock signal providing the pre-charge state for a second group of circuits. In other embodiments (not shown), more than two clock signals are utilized.

The two clock signals have the same clock period, to maintain the same timing relationship between the two signals. In the embodiment of FIGS. 15–22, the two clock signals are overlapping clock signals, i.e., the situation never occurs where both clock signals are low at the same time. Therefore, neither group of circuits performs an evaluation while a preceding circuit is providing a pre-charged output signal. This period of overlap is long enough to allow time for the first dynamic gate delay, as well as for any skew that might occur between the two clock signals. In addition, the overlap period allows for time-borrowing between the two clocks when there is an imbalance between the delays that precede and follow a dynamic element.

To take full advantage of this type of logic, it is desirable to develop PLD implementation software that can efficiently make use of latch-based logic, e.g., by converting flip-flop based netlists to latch-based netlists, to partition logic such that the delays between clock transition are approximately equal, and so forth.

Figure 15:
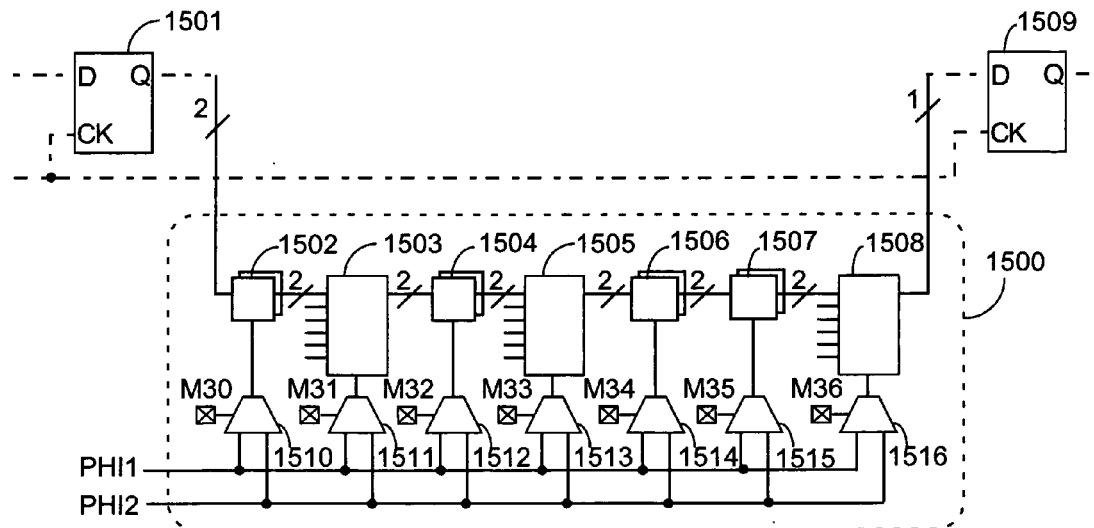
FIG. 15 illustrates an exemplary signal path in a second dynamic PLD.

FIG. 15 illustrates an exemplary signal path 1500 in a dynamic PLD that utilizes two phased clock signals. Note that since the logic elements are clocked, the flip-flops 1501, 1509 that precede and follow the signal path 1500 are optional. The flip-flops can be useful, for example, when only some of the logic is dynamic, and the flip-flops are used to interface the dynamic logic with other clocked logic utilizing a different clock signal.

In the embodiment of FIG. 15, both interconnect elements (1502, 1504, 1506, and 1507) and LUT circuits (1503, 1505, and 1508) are clocked. A clock signal is provided to each clocked element 1502–1508 by an associated programmable multiplexer 1510–1516, respectively. Each multiplexer 1510–1516 is controlled by an associated configuration memory cell M30–M36, respectively. Thus, the amount of logic clocked by each clock signal PHI1, PHI2 is adjustable. By selectively programming values into the memory cells, the location of the dividing line(s) between groups of logic clocked by different clock signals can be altered to accommodate the needs of the design implemented in the PLD. For example, depending on the speed of the clock signals and the logic elements, different numbers of dynamic logic elements can be included in each pipeline stage of the signal path.

As in the embodiment of FIG. 7, two interconnect elements are used to interconnect each LUT circuit, as shown in FIG. 15, because both true and complement signals are provided to the LUT circuits. In the illustrated signal path 1500, the true and complement signals from flip-flop 1501 sequentially traverse interconnect 1502 (two elements), LUT circuit 1503 (a single LUT circuit receiving both true and complement input signals and providing both true and complement output signals), interconnect 1504 (two elements), LUT circuit 1505 (a single LUT circuit), interconnect 1506 (two elements), interconnect 1507 (two elements), and LUT circuit 1508 (a single LUT circuit).

Figure 1:
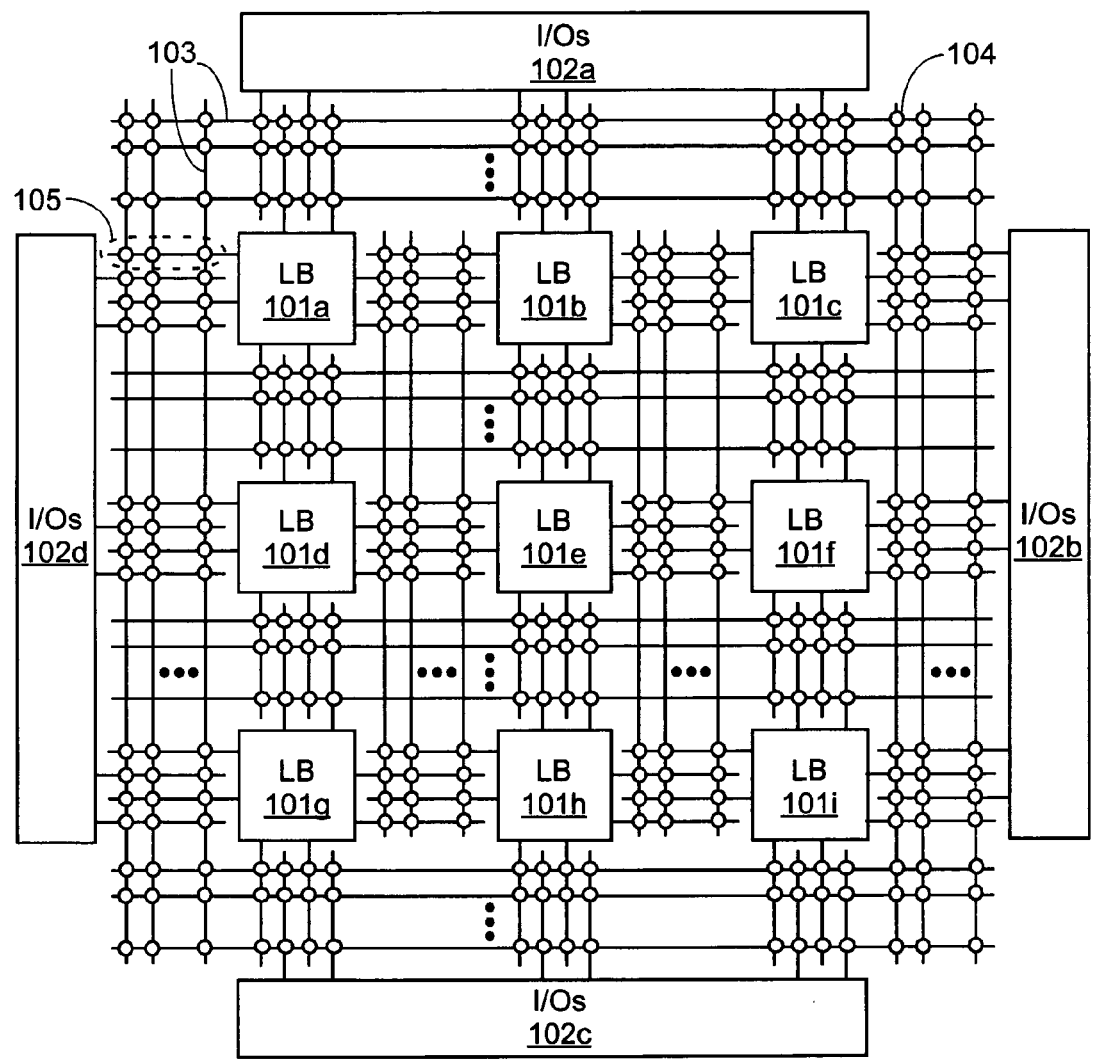
FIG. 1 is a simplified diagram of a well known Field Programmable Gate Array (FPGA) architecture.
Figure 2:
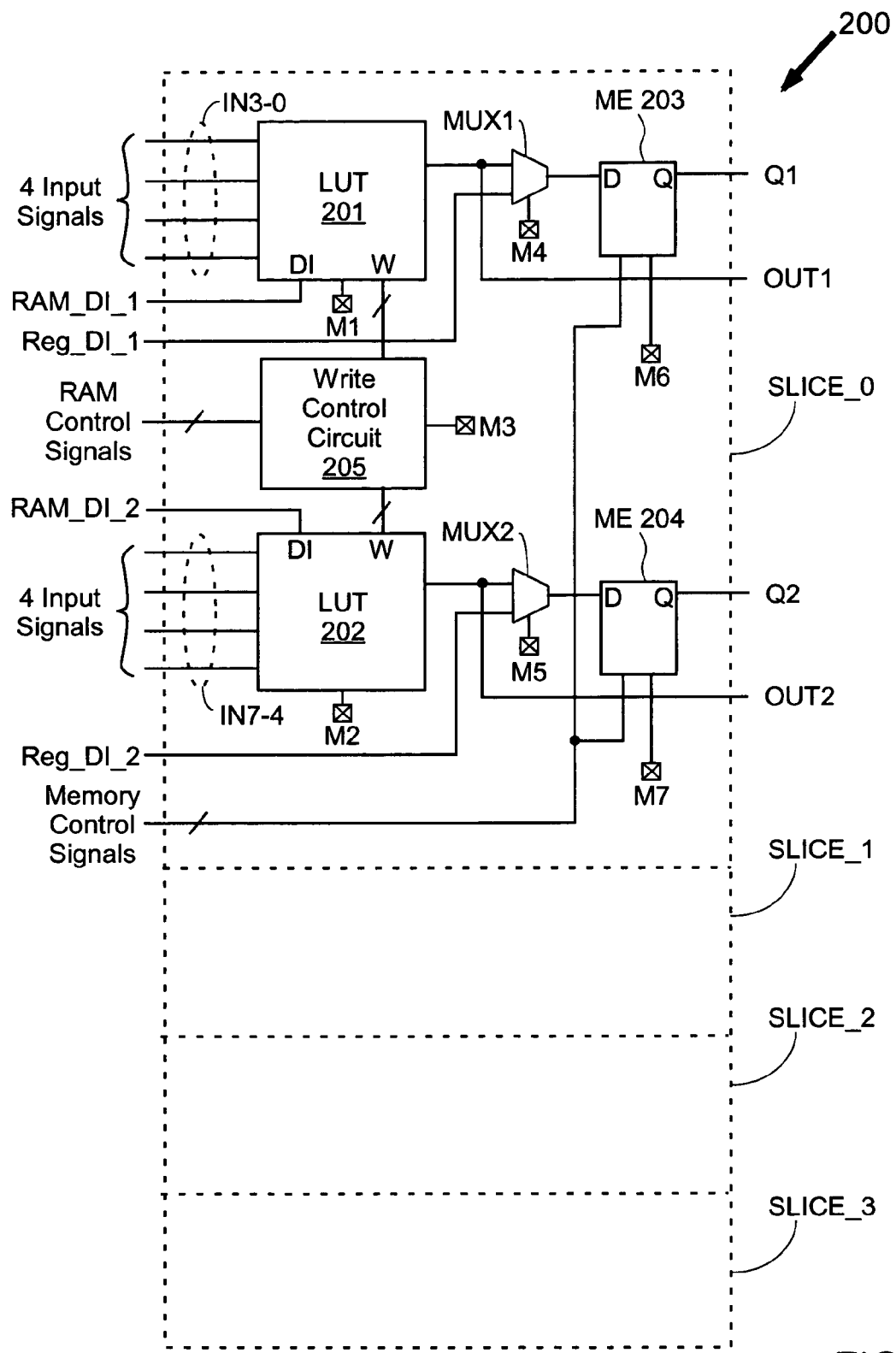
FIG. 2 is a simplified illustration of a known configurable logic element (CLE) in a Xilinx FPGA.
Figure 3:
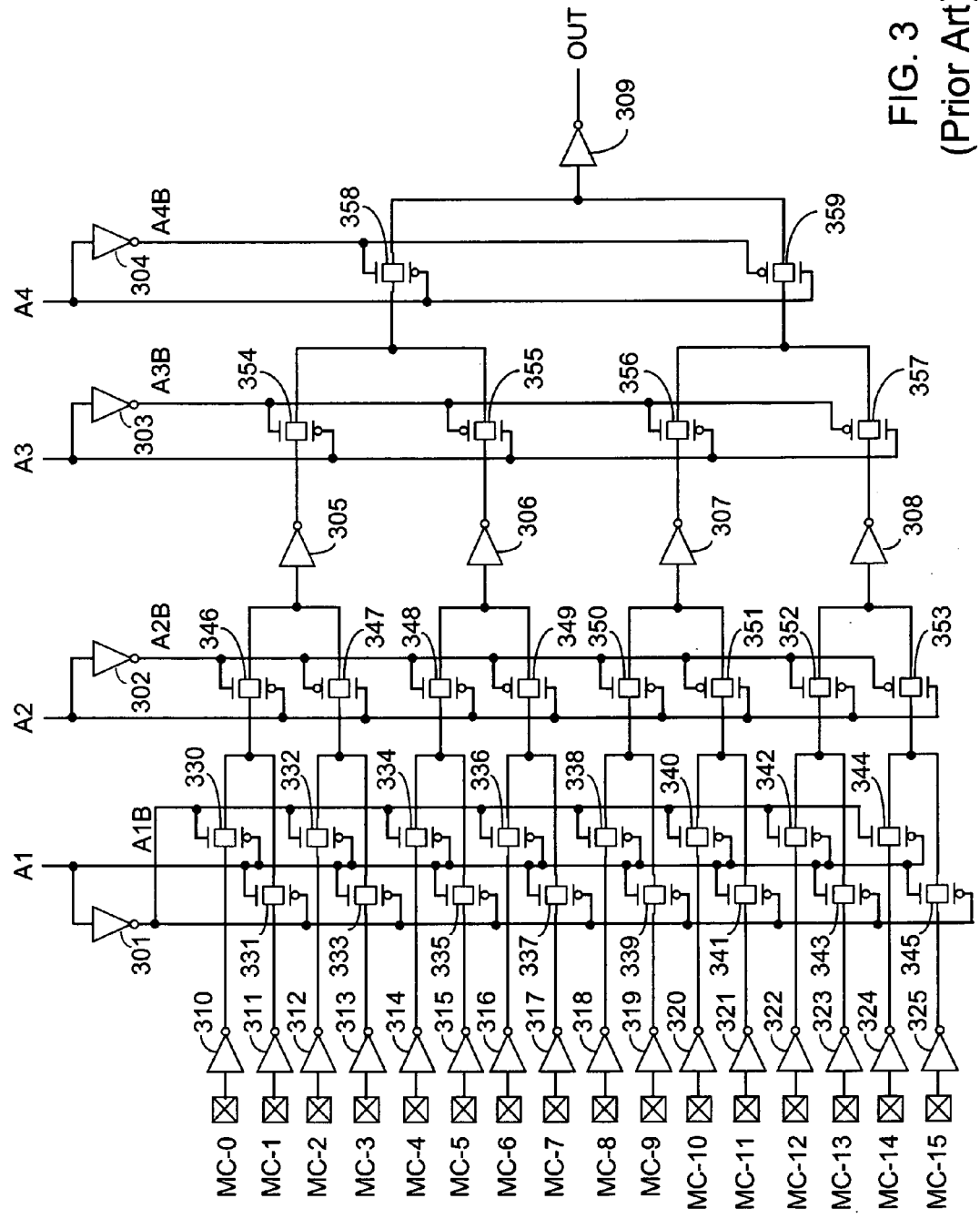
FIG. 3 illustrates a known lookup table (LUT) circuit that can be included in the programmable logic portion of a PLD.
Figure 4:
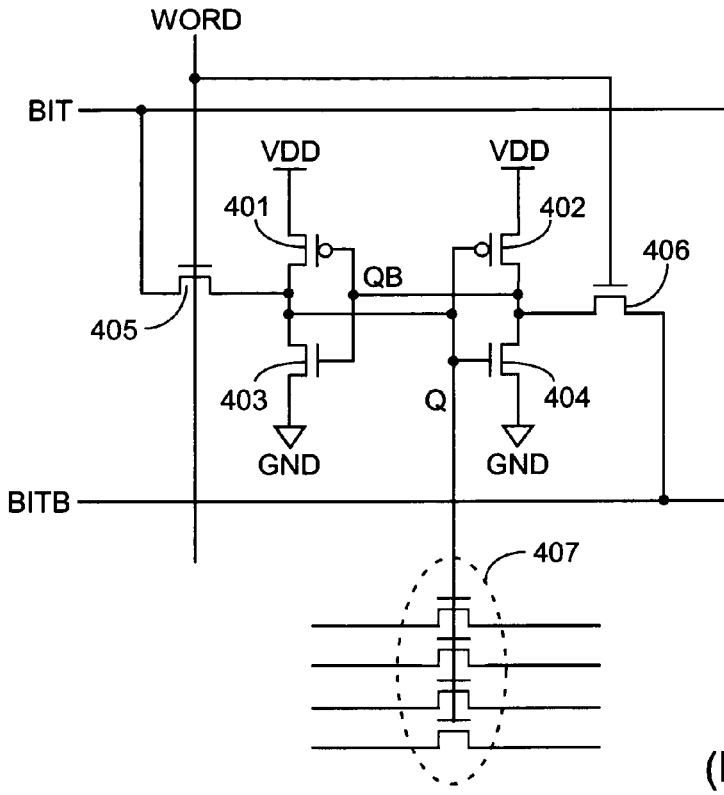
FIG. 4 illustrates a well known configuration memory cell that can be used in an FPGA, and the use thereof to control transistors within the FPGA.
Figure 5:
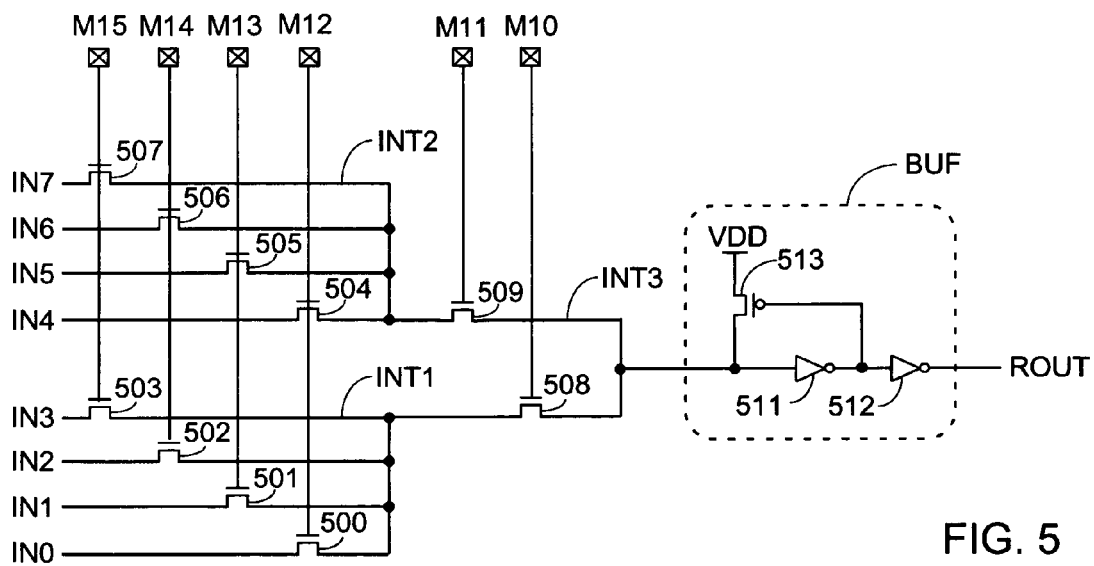
FIG. 5 illustrates a well known programmable routing multiplexer that can be used, for example, in the interconnect structure of a PLD.

As shown in FIG. 2, a CLE typically includes more than one LUT circuit. In some embodiments, all LUT circuits in a CLE share a common clock domain. In some of these embodiments, a single configuration memory cell and multiplexer control the clock selection for more than one LUT circuit. In one embodiment, each CLE includes eight LUT circuits, all of which share a single multiplexer that selects between signals PHI1 and PHI2. The selected clock signal controls the pre-charge and evaluation states of all of the LUT circuits in the CLE. In one embodiment, each CLE includes eight LUT circuits organized into four pairs. Each pair of LUT circuits shares a single multiplexer that selects between signals PHI1 and PHI2.

Figure 16:
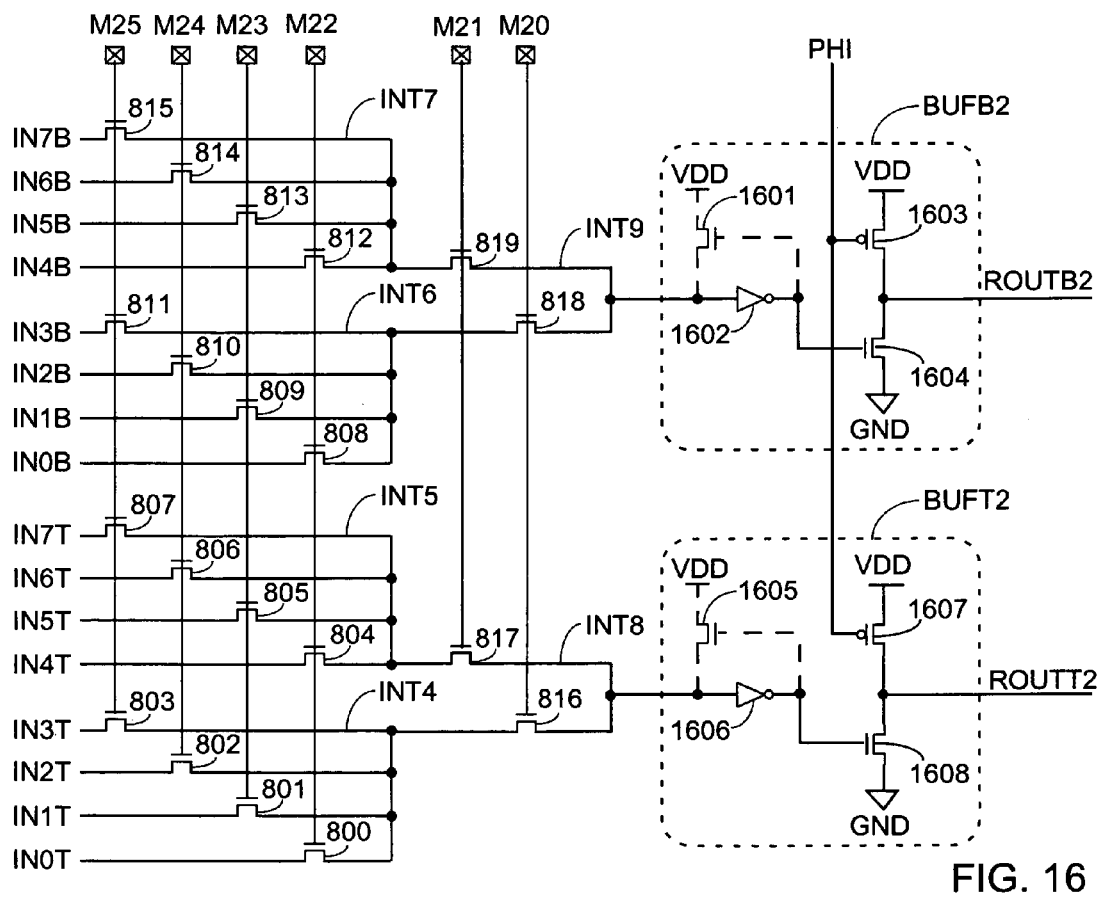
FIG. 16 illustrates an exemplary pair of routing multiplexers that can be used, for example, in the dynamic PLD of FIG. 15.

FIG. 16 illustrates an exemplary pair of routing multiplexers that can be used, for example, in the dynamic PLD of FIG. 15. The routing multiplexers of FIG. 16 are similar to those of FIG. 8, except for the buffers at the circuit output terminals.

In the embodiment of FIG. 16, the signal on internal node INT8 is buffered by buffer BUFT2 to provide true output signal ROUTT2. Buffer BUFT2 includes an inverter 1606 with an optional pullup (e.g., a P-channel transistor 1605 to power high VDD) on internal node INT8, gated by the output of inverter 1606. Inverter 1606 also gates a pulldown (e.g., an N-channel transistor 1608 to ground GND) on output terminal ROUTT2. A pullup 1607 on output terminal ROUTT2 is gated by a clock signal PHI. Thus, a low value on signal PHI pre-charges output signal ROUTT2 high. When signal PHI goes high, output signal ROUTT2 goes low if node INT8 is low, otherwise output signal ROUTT2 stays high.

Similarly, the signal on internal node INT9 is buffered by buffer BUFB2 to provide complement output signal ROUTB2. Buffer BUFB2 includes an inverter 1602 with an optional pullup 1601 on internal node INT9, gated by the output of inverter 1602. Inverter 1602 also gates a pulldown 1604 on output terminal ROUTB2. A pullup 1603 on output terminal ROUTB2 is gated by the clock signal PHI. Thus, a low value on signal PHI pre-charges output signal ROUTB2 high. When signal PHI goes high, output signal ROUTB2 goes low if node INT9 is low, otherwise output signal ROUTB2 stays high.

As in the embodiment of FIG. 8, configuration memory cells M20–M25 are shared between the two paired routing multiplexers illustrated in FIG. 15. Because memory cells consume an appreciable amount of area, this dual use of the memory cells provides a significant area savings over using two separate sets of memory cells to control two paired routing multiplexers. However, in some embodiments (not shown), each routing multiplexer is controlled by an independent set of memory cells.

Figure 17:
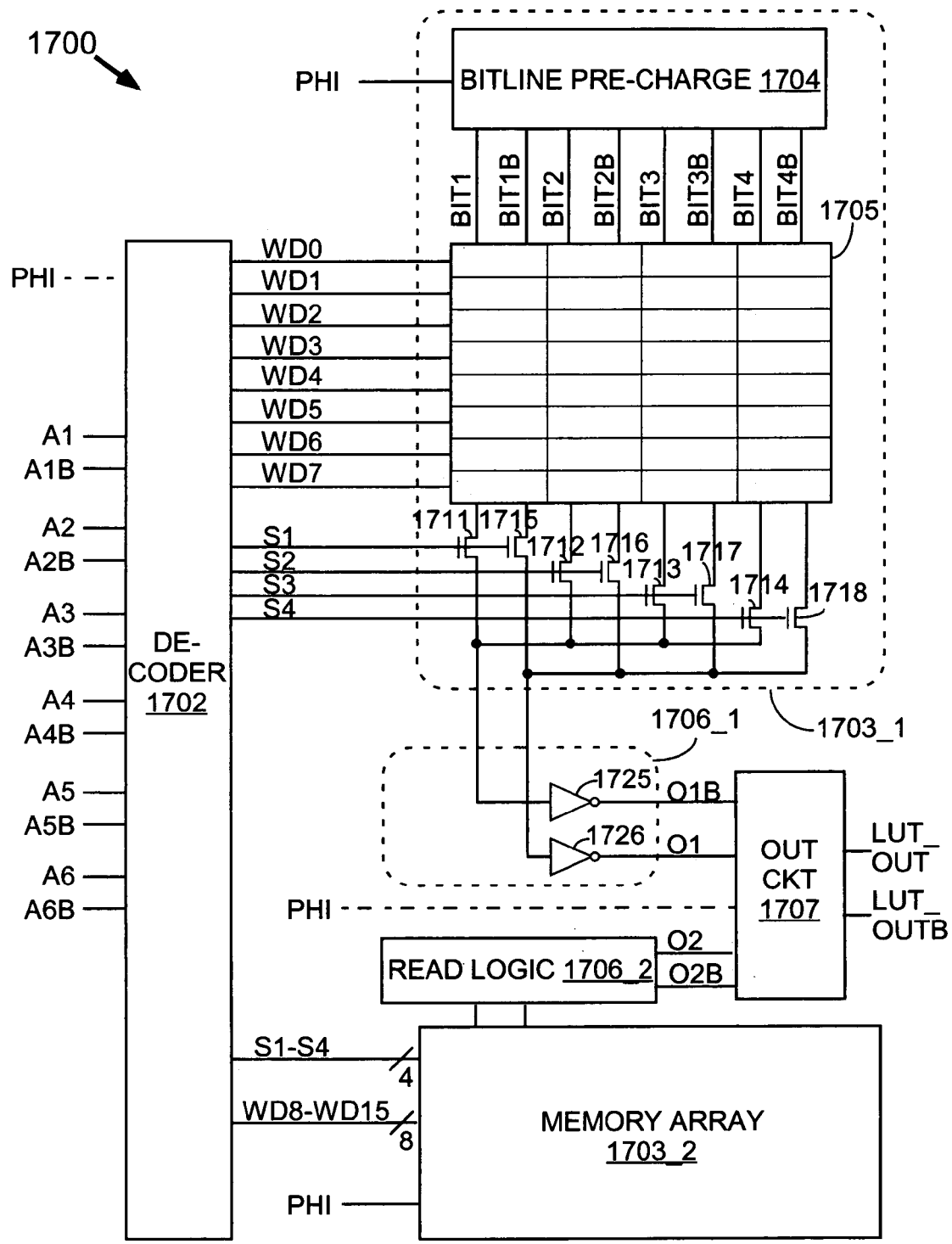
FIG. 17 illustrates a dynamic LUT circuit that can be used, for example, in the dynamic PLD of FIG. 15.

FIG. 17 illustrates a dynamic lookup table circuit that can be used, for example, in the dynamic PLD of FIG. 15. LUT circuit 1700 is similar in some respects to the self-resetting LUT circuit 900 illustrated in FIG. 9, and similar elements are not again described. However, LUT circuit 1700 is simpler than LUT circuit 900, because the timing of the pre-charge and evaluation states is controlled by an external clock signal PHI, rather than by internally generated pre-charge and reset signals.

The circuit of FIG. 17 includes a decoder 1702, memory arrays 1703_1 and 1703_2, read logic circuits 1706_1 and 1706_2, and an output circuit 1707, coupled together as shown in FIG. 17. Memory arrays 1703_1, 1703_2 each include a bitline pre-charge circuit 1704, an array of memory cells 1705, and a read multiplexer comprising N-channel transistors 1711–1718, coupled together as shown in FIG. 17. Read logic circuits 1706_1 and 1706_2 each include two inverters 1725, 1726 coupled between the read multiplexer and output circuit 1707 and providing signals O1, O1B and O2, O2B to the output circuit 907.

The circuit of FIG. 17 functions in a similar fashion to the circuit of FIG. 9, except that the pre-charge state is active whenever signal PHI is low, and the evaluation state is active whenever signal PHI is high.

Note that no decoder interface circuit is required between the input signals A1–A6, A1B–A6B and decoder 1702. Instead, the input signals are provided directly to decoder 1702. Decoder 1702 can be implemented, for example, in a fashion similar to decoder 902 of FIG. 11. In FIG. 17, the external clock signal PHI provided to decoder 1702 is shown as a dashed line, indicating that the signal is optional. Signal PHI is an optional input to decoder 1702, because in the pictured embodiment decoder 1702 can be implemented using either static or dynamic circuitry. When the circuit of FIG. 11 is used to implement decoder 1702, NAND gates 1101–1108 can be implemented as standard NAND gates, as shown in FIG. 18, or as dynamic logic, as shown in FIG. 19. Note that in both implementations inverters are added to each input signal to ensure an odd number of inversions on each signal path. Thus, wordline signals WD0–WD15 are all low during the pre-charge state.

FIG. 18 illustrates a static implementation of NAND gates 1101–1108 that can be used in decoder 1702 when the implementation shown in FIG. 11 is used. The NAND circuit of FIG. 18 includes two pullups (e.g., P-channel transistors to power high VDD) 1801, 1802 coupled in parallel to the NAND output node, two pulldowns (e.g., N-channel transistors to ground GND) 1803, 1804 coupled in series to the NAND output node, and two inverters 1805, 1806. Inverters 1805, 1806 are added on each input signal, as described above, to ensure that the wordlines remain low during the pre-charge state. Each inverter 1805, 1806 drives one of the pullups and one of the pulldowns, implementing a standard NAND gate.

FIG. 19 illustrates a dynamic implementation of NAND gates 1101–1108 that can be used in decoder 1702 when the implementation shown in FIG. 11 is used. The dynamic NAND circuit of FIG. 19 includes one pullup (e.g., a P-channel transistor to power high VDD) 1901 coupled to the NAND output node, two pulldowns (e.g., N-channel transistors to ground GND) 1902, 1903 coupled in series to the NAND output node, and two inverters 1904, 1905. Inverters 1904, 1905 are added on each input signal, as described above, to ensure that the wordlines remain low during the pre-charge state. Each inverter 1904, 1905 drives one of the pulldowns. The pullup 1901 is gated by an external clock signal PHI.

FIG. 20 illustrates an exemplary implementation of bitline pre-charge circuit 1704 that can be used, for example, in the LUT circuit of FIG. 17. Each bitline BIT1–BIT4 and BIT1B–BIT4B in array 1705 of memory cells has an attached pullup 2001–2008, implemented in the pictured embodiment as P-channel transistors. Pullups 2001–2008 are gated by the external clock signal PHI.

Note that the external clock signal PHI provided to output circuit 1707 in FIG. 17 is a dashed line, indicating that the signal is optional. Signal PHI is an optional input to output circuit 1707, because in the pictured embodiment output circuit 1707 can be implemented using either static or dynamic circuitry.

FIG. 21 illustrates a static implementation of LUT output circuit 1707 that can be used, for example, in the LUT circuit of FIG. 17. In this embodiment, output circuit 1707 includes two copies of the illustrated logic gate 2100. The illustrated logic gate 2100 includes P-channel transistors 2101–2102 and N-channel transistors 2103–2104, coupled together to form a standard NOR gate as shown in FIG. 21. A first NOR gate is driven by signals O1 and O2 and provides the complement LUT output signal LUT_OUTB. A second NOR gate is driven by signals O1B and O1B and provides the true LUT output signal LUT_OUT.

FIG. 22 illustrates a dynamic implementation of LUT output circuit 1707 that can be used, for example, in the LUT circuit of FIG. 17. In this embodiment, output circuit 1707 includes two copies of the illustrated logic gate 2200. The illustrated logic gate 2200 includes a single P-channel transistor 2201 and N-channel transistors 2202–2203, coupled together as shown in FIG. 22. A first copy of circuit 2200 is driven by signals O1 and O2 and provides the complement LUT output signal LUT_OUTB. A second copy of circuit 2200 is driven by signals O1B and 01B and provides the true LUT output signal LUT_OUT. Note that when signal PHI is low, both LUT output signals LUT_OUT, LUT_OUTB are high (the pre-charge state). When signal PHI is high, the values on the LUT output terminals reflect the values provided by one of the two memory arrays 1703_1, 1703_2 (the evaluation state).

In some embodiments, some or all of the circuits illustrated in FIGS. 15–22 are skewed to increase the speed of the evaluation (i.e., the response to rising edges of the external clock signal PHI) relative to the speed of the pre-charge (i.e., the response to falling edges of the external clock signal PHI). Methods of skewing logic circuitry are well known to those of skill in the relevant arts.

A disadvantage of dynamic logic is that it typically consumes more power than static logic, because a larger number of nodes is being periodically pre-charged and discharged. Therefore, it might be desirable to include in a PLD both dynamic programmable logic and static programmable logic. Thus, user logic requiring the fastest possible implementation can be implemented in dynamic logic, while user logic not on the critical path can be implemented in static logic. In some embodiments, the PLD implementation software evaluates the timing of critical paths and determines which portions of a design should be implemented using the dynamic logic portions of the PLD, and allocates this critical logic accordingly.

A desirable feature in a PLD that includes both static and dynamic programmable logic elements is the ability to use the same clock domain for the static and dynamic portions of the circuit. To provide this functionality, the two clock signals can be generated with specific duty cycle requirements (e.g., 50/50) and overlap requirements as required by the dynamic portions of the circuit, while keeping the same duty cycle for the static portions. One way to accomplish this is to use the on-chip clock managers often included in PLDs to generate the two phases of the clock. This approach allows the static/dynamic logic combinations work together seamlessly.

Figure 23:
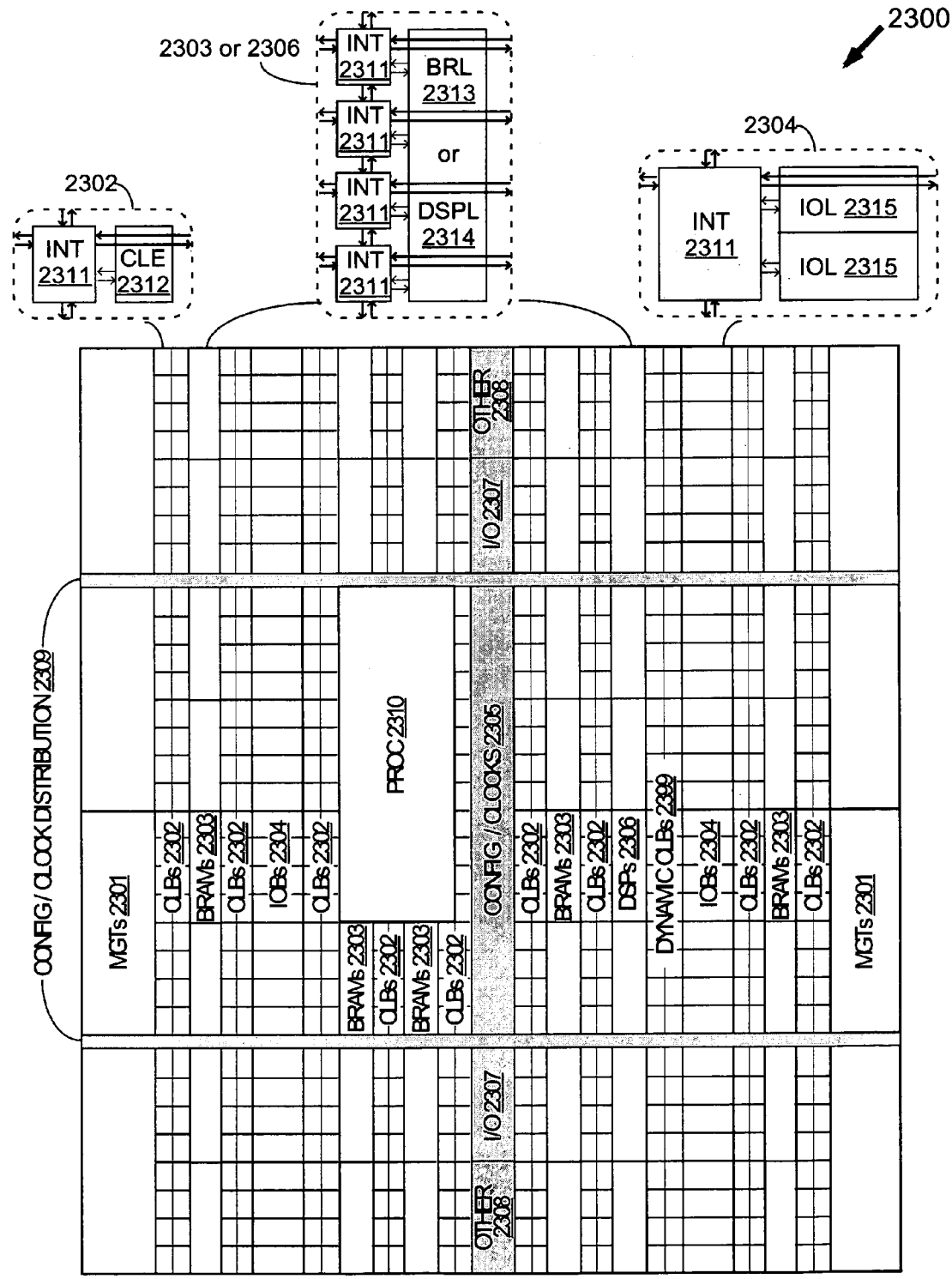
FIG. 23 is a block diagram of an exemplary FPGA that can include, for example, the dynamic circuits illustrated herein.

FIG. 23 illustrates an FPGA that is largely constructed of static logic but includes two adjacent columns of dynamic logic. Note that other embodiments include only one column of dynamic logic, or larger numbers of such columns. Additionally, the columns of dynamic logic might or might not be adjacent to one another.

FIG. 23 illustrates an FPGA architecture 2300 that includes a large number of programmable tiles implemented using static logic. These static logic blocks include multi-gigabit transceivers (MGTs 2301), configurable logic blocks (CLBs 2302), random access memory blocks (BRAMs 2303), input/output blocks (IOBs 2304), configuration and clocking logic (CONFIG/CLOCKS 2305), digital signal processing blocks (DSPs 2306), specialized input/output blocks (I/O 2307) (e.g., configuration ports and clock ports), and other programmable logic 2308 such as digital clock managers, analog-to-digital converters, system monitoring logic, and so forth. Some FPGAs also include dedicated processor blocks (PROC 2310). Note that in some embodiments at least some of these logic blocks are implemented using dynamic logic instead of or in addition to static logic. For example, in one embodiment DSPs 2306 are implemented using dynamic logic.

The FPGA of FIG. 23 also includes an exemplary column of dynamic configurable logic blocks 2399. The interconnect portions of dynamic CLBs 2399 can include, for example, routing multiplexers implemented as shown in FIGS. 8 and 16. Dynamic CLBs 2399 can also include programmable LUT circuits such as those shown in FIGS. 9–14 and 17–22, for example.

In some FPGAs, each static programmable tile includes a programmable interconnect element (INT 2311) having standardized connections to and from a corresponding interconnect element in each adjacent tile. Therefore, the programmable interconnect elements taken together implement the programmable interconnect structure for the illustrated FPGA. The programmable interconnect element (INT 2311) also includes the connections to and from the programmable logic element within the same tile, as shown by the examples included at the top of FIG. 23. In some embodiments, the dynamic CLBs 2399 include the same interconnect element (INT 2311). In other embodiments, the dynamic CLBs 2399 include dynamic interconnect elements such as those described above.

A CLB 2302 can include a configurable logic element (CLE 2312) that can be programmed to implement user logic plus a single programmable interconnect element (INT 2311). A BRAM 2303 can include a BRAM logic element (BRL 2313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 2306 can include a DSP logic element (DSPL 2314) in addition to an appropriate number of programmable interconnect elements. An IOB 2304 can include, for example, two instances of an input/output logic element (IOL 2315) in addition to one instance of the programmable interconnect element (INT 2311). As will be clear to those of skill in the art, the actual I/O pads connected, for example, to the I/O logic element 2315 are manufactured using metal layered above the various illustrated logic blocks, and typically are not confined to the area of the input/output logic element 2315.

In the pictured embodiment, a columnar area near the center of the die (shown shaded in FIG. 23) is used for configuration, clock, and other control logic. Horizontal areas 2309 extending from this column are used to distribute the clocks and configuration signals across the breadth of the FPGA.

Some FPGAs utilizing the architecture illustrated in FIG. 23 include additional logic blocks that disrupt the regular columnar structure making up a large part of the FPGA. The additional logic blocks can be programmable blocks and/or dedicated logic. For example, the processor block PROC 2310 shown in FIG. 23 spans several columns of CLBs and BRAMs.

Note that FIG. 23 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 23 are purely exemplary. For example, in an actual FPGA more than one adjacent column of CLBs is typically included wherever the CLBs appear, to facilitate the efficient implementation of user logic.

Those having skill in the relevant arts of the invention will now perceive various modifications and additions that can be made as a result of the disclosure herein. For example, the above text describes the circuits of the invention in the context of programmable logic devices (PLDs) such as field programmable gate arrays (FPGAs). However, the circuits of the invention can also be implemented in other types of programmable electronic circuits and systems.

Further, pass gates, pullups, pulldowns, transistors, N-channel transistors, P-channel transistors, memory cells, memory arrays, latches, memory cells, configuration memory cells, buffers, inverters, NAND gates, NAND circuits, static NAND circuits, dynamic NAND circuits, NOR circuits, static NOR circuits, dynamic NOR circuits, exclusive OR circuits, exclusive NOR circuits, decoders, decoder circuits, decoder interface circuits, multiplexers, routing multiplexers, lookup tables (LUTs), LUT circuits, LUT output circuits, configurable logic elements (CLEs), configurable logic blocks (CLBs), interconnect structures, logic blocks, and other components other than those described herein can be used to implement the invention. Active-low signals can be replaced with active-high signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A programmable logic device (PLD), comprising:
a plurality of dynamic lookup table (LUT) circuits, each dynamic LUT circuit comprising a plurality of paired true and complement input terminals and a pair of true and complement output terminals, each of the true and complement output terminals being configured and arranged to provide a dynamic output signal precharged to a first known value; and
an interconnect structure programmably interconnecting the dynamic LUT circuits one to another via the true and complement input terminals and the true and complement output terminals of the dynamic LUT circuits.

2. The PLD of claim 1, wherein the first known value is a high value.

3. The PLD of claim 1, further comprising a plurality of flip-flops, each flip-flop being programmably coupled between one of the true and complement output terminals of a corresponding dynamic LUT circuit and the interconnect structure.

4. The PLD of claim 1, wherein the plurality of paired true and complement input terminals comprises six true input terminals and six complement input terminals.

5. The PLD of claim 1, wherein the PLD comprises a field programmable gate array (FPGA).

6. The PLD of claim 1, wherein the interconnect structure comprises a plurality of routing multiplexers, each routing multiplexer comprising skewed logic configured and arranged to pass a change in value from the first known value to a second known value more quickly than a change in value from the second known value to the first known value.

7. The PLD of claim 6, wherein the first known value is a high value and the second known value is a low value.

8. The PLD of claim 1, wherein each dynamic LUT circuit comprises skewed logic configured and arranged to pass a change in value from the first known value to a second known value more quickly than a change in value from the second known value to the first known value.

9. The PLD of claim 8, wherein the first known value is a high value and the second known value is a low value.

10. The PLD of claim 1, wherein at least one of the dynamic LUT circuits comprises a self-resetting LUT circuit.

11. The PLD of claim 10, further comprising:
a plurality of flip-flop interface circuits, each flip-flop interface circuit having an input terminal coupled to one of the true and complement output terminals of a corresponding one of the dynamic LUT circuits, a clock input terminal, and an output terminal; and a plurality of flip-flops, each flip-flop having a data input terminal coupled to the output terminal of a corresponding one of the flip-flop interface circuits and further having a pair of true and complement output terminals coupled to the interconnect structure.

12. The PLD of claim 11, wherein each flip-flop interface circuit comprises a latch coupled between the input terminal and the output terminal of the flip-flop interface circuit, each latch having a pre-charge input terminal coupled to the clock input terminal of a corresponding one of the flip-flops.

13. The PLD of claim 10, wherein the self-resetting LUT circuit comprises:

a memory array comprising a plurality of bitlines, a plurality of input terminals coupled to the interconnect structure, and a plurality of output terminals;

a pre-charge generator circuit having a plurality of input terminals coupled to the interconnect structure and a pre-charge output terminal;

a bitline pre-charge circuit coupled to the bitlines, the bitline pre-charge circuit having a pre-charge input terminal coupled to the pre-charge output terminal of the pre-charge generator circuit and further having a reset input terminal; and an output circuit having a plurality of input terminals coupled to the output terminals of the memory array, true and complement output terminals coupled to the true and complement output terminals of the self-resetting LUT circuit, and a reset output terminal coupled to the reset input terminal of the bitline pre-charge circuit.

14. The PLD of claim 13, wherein the output circuit comprises an exclusive OR gate having input terminals coupled to the true and complement output terminals of the output LUT circuit and further having an output terminal coupled to the reset output terminal of the output circuit.

15. The PLD of claim 13, wherein the self-resetting LUT circuit further comprises:

a decoder circuit coupled between the interconnect structure and the memory array, the decoder circuit comprising a decoder interface circuit coupled to the interconnect structure and a decoder coupled between the decoder interface circuit and the memory array, wherein the decoder interface circuit comprises a plurality of latches coupled between the interconnect structure and the decoder, each of the latches having a reset input terminal coupled to the reset output terminal of the output circuit.

16. The PLD of claim 15, wherein:

the memory array further comprises an array of memory cells coupled to the bitlines and a read multiplexer coupled between the bitlines and the output terminals of the memory array;

the decoder circuit is configured and arranged to more slowly pass first input signals from a first plurality of input terminals, and is further configured and arranged to more quickly pass second input signals from a second plurality of input terminals;

the decoder circuit is configured and arranged to provide from the first input signals a plurality of first decoded signals to the array of memory cells; and the decoder circuit is further configured and arranged to provide from the second input signals a plurality of second decoded signals to the read multiplexer.

17. The PLD of claim 16, wherein the first plurality of input terminals of the decoder circuit comprise eight paired true and complement input terminals and the second plurality of input terminals of the decoder circuit comprise four paired true and complement input terminals.

18. The PLD of claim 16, wherein the read multiplexer comprises two paired output terminals configured and arranged to provide signals derived from two paired ones of the bitlines.

19. The PLD of claim 13, wherein the self-resetting LUT circuit further comprises:

a read logic circuit coupled between the output terminals of the memory array and the input terminals of the output circuit, the read logic circuit having a pre-charge input terminal coupled to the pre-charge output terminal of the pre-charge generator circuit and further having a reset input terminal coupled to the reset output terminal of the output circuit.

20. The PLD of claim 1, wherein at least one of the dynamic LUT circuits comprises a clock input terminal, the PLD further comprising:

a memory cell; and a clock multiplexer having an output terminal coupled to the clock input terminal of the at least one dynamic LUT circuit, a first data input terminal coupled to receive a first clock signal, a second data input terminal coupled to receive a second clock signal, and a select terminal coupled to the memory cell.

21. The PLD of claim 20, wherein the PLD comprises a field programmable gate array (FPGA), and the memory cell comprises a configuration memory cell of the FPGA.

22. The PLD of claim 1, wherein the interconnect structure comprises a plurality of routing multiplexers, and at least one of the routing multiplexers comprises a dynamic routing multiplexer having an output terminal configured and arranged to provide a dynamic output signal pre-charged to the first known value.

23. The PLD of claim 22, wherein the first known value is a high value.

24. The PLD of claim 22, wherein the dynamic routing multiplexer comprises a clock input terminal, the PLD further comprising:

a memory cell; and a clock multiplexer having an output terminal coupled to the clock input terminal of the dynamic routing multiplexer, a first data input terminal coupled to receive a first clock signal, a second data input terminal coupled to receive a second clock signal, and a select terminal coupled to the memory cell.

25. The PLD of claim 24, wherein the PLD comprises a field programmable gate array (FPGA) and the memory cell comprises a configuration memory cell of the FPGA.

26. The PLD of claim 1, wherein the interconnect structure comprises a plurality of routing multiplexers coupled into pairs configured and arranged to pass paired true and complement output signals.

27. The PLD of claim 26, further comprising, for each pair of the routing multiplexers:

a plurality of memory cells, each memory cell being coupled to each of the routing multiplexers in the pair of routing multiplexers.

28. The PLD of claim 27, wherein the PLD comprises a field programmable gate array (FPGA), and the memory cells comprise configuration memory cells of the FPGA.

29. The PLD of claim 26, wherein each of the routing multiplexers is configured and arranged to provide a dynamic output signal pre-charged to the first known value.

30. The PLD of claim 26, wherein each of the routing multiplexers is configured and arranged to provide a static output signal.

31. A programmable logic device (PLD), comprising:
a plurality of programmable static logic circuits;
a plurality of dynamic lookup table (LUT) circuits, each dynamic LUT circuit comprising a plurality of paired true and complement input terminals and a pair of true and complement output terminals, each of the true and complement output terminals being configured and arranged to provide a dynamic output signal pre-charged to a first known value; and
an interconnect structure coupled to the dynamic LUT circuits via the true and complement input terminals and the true and complement output terminals of the dynamic LUT circuits and further coupled to the programmable static logic circuits.

32. The PLD of claim 31, wherein the plurality of programmable static logic circuits comprise a plurality of static LUT circuits.

33. The PLD of claim 31, wherein:
the plurality of programmable static logic circuits are arranged to form a first column;
the plurality of dynamic LUT circuits are arranged to form a second column; and
the PLD comprises a row of columns that includes the first and second columns.

34. The PLD of claim 31, wherein the first known value is a high value.

35. The PLD of claim 31, further comprising a plurality of flip-flops, each flip-flop being programmably coupled between one of the true and complement output terminals of a corresponding dynamic LUT circuit and the interconnect structure.

36. The PLD of claim 31, wherein the PLD comprises a field programmable gate array (FPGA).

37. The PLD of claim 31, wherein the interconnect structure comprises a plurality of routing multiplexers, each routing multiplexer comprising skewed logic configured and arranged to pass a change in value from the first known value to a second known value more quickly than a change in value from the second known value to the first known value.

38. The PLD of claim 37, wherein the first known value is a high value and the second known value is a low value.

39. The PLD of claim 31, wherein each dynamic LUT circuit comprises skewed logic configured and arranged to pass a change in value from the first known value to a second known value more quickly than a change in value from the second known value to the first known value.

40. The PLD of claim 39, wherein the first known value is a high value and the second known value is a low value.

41. The PLD of claim 31, wherein at least one of the dynamic LUT circuits comprises a self-resetting LUT circuit.

42. The PLD of claim 41, further comprising:
a plurality of flip-flop interface circuits, each flip-flop interface circuit having an input terminal coupled to one of the true and complement output terminals of a corresponding one of the dynamic LUT circuits, a clock input terminal, and an output terminal; and
a plurality of flip-flops, each flip-flop having a data input terminal coupled to the output terminal of a corresponding one of the flip-flop interface circuits and further having a pair of true and complement output terminals coupled to the interconnect structure.

43. The PLD of claim 41, wherein the self-resetting LUT circuit comprises:
a memory array comprising a plurality of bitlines, a plurality of input terminals coupled to the interconnect structure, and a plurality of output terminals;
a pre-charge generator circuit having a plurality of input terminals coupled to the interconnect structure and a pre-charge output terminal;
a bitline pre-charge circuit coupled to the bitlines, the bitline pre-charge circuit having a pre-charge input terminal coupled to the pre-charge output terminal of the pre-charge generator circuit and further having a reset input terminal; and
an output circuit having a plurality of input terminals coupled to the output terminals of the memory array, true and complement output terminals coupled to the true and complement output terminals of the self-resetting LUT circuit, and a reset output terminal coupled to the reset input terminal of the bitline pre-charge circuit.

44. The PLD of claim 43, wherein the self-resetting LUT circuit further comprises:
a decoder circuit coupled between the interconnect structure and the memory array, the decoder circuit comprising a decoder interface circuit coupled to the interconnect structure and a decoder coupled between the decoder interface circuit and the memory array,
wherein the decoder interface circuit comprises a plurality of latches coupled between the interconnect structure and the decoder, each of the latches having a reset input terminal coupled to the reset output terminal of the output circuit.

45. The PLD of claim 44, wherein:
the memory array further comprises an array of memory cells coupled to the bitlines and a read multiplexer coupled between the bitlines and the output terminals of the memory array;
the decoder circuit is configured and arranged to more slowly pass first input signals from a first plurality of input terminals, and is further configured and arranged to more quickly pass second input signals from a second plurality of input terminals;
the decoder circuit is configured and arranged to provide from the first input signals a plurality of first decoded signals to the array of memory cells; and
the decoder circuit is further configured and arranged to provide from the second input signals a plurality of second decoded signals to the read multiplexer.

46. The PLD of claim 45, wherein the first plurality of input terminals of the decoder circuit comprise eight paired true and complement input terminals and the second plurality of input terminals of the decoder circuit comprise four paired true and complement input terminals.

47. The PLD of claim 45, wherein the read multiplexer comprises two paired output terminals configured and arranged to provide signals derived from two paired ones of the bitlines.

48. The PLD of claim 44, wherein the self-resetting LUT circuit further comprises:
a read logic circuit coupled between the output terminals of the memory array and the input terminals of the output circuit, the read logic circuit having a pre-charge input terminal coupled to the pre-charge output terminal of the pre-charge generator circuit and further having a reset input terminal coupled to the reset output terminal of the output circuit.

49. The PLD of claim 31, wherein at least one of the dynamic LUT circuits comprises a clock input terminal, the PLD further comprising:
 a memory cell; and
 a clock multiplexer having an output terminal coupled to the clock input terminal of the at least one dynamic LUT circuit, a first data input terminal coupled to receive a first clock signal, a second data input terminal coupled to receive a second clock signal, and a select terminal coupled to the memory cell.

50. The PLD of claim 49, wherein the PLD comprises a field programmable gate array (FPGA), and the memory cell comprises a configuration memory cell of the FPGA.

51. The PLD of claim 31, wherein the interconnect structure comprises a plurality of routing multiplexers, and at least one of the routing multiplexers comprises a dynamic routing multiplexer having an output terminal configured and arranged to provide a dynamic output signal pre-charged to the first known value.

52. The PLD of claim 51, wherein the first known value is a high value.

53. The PLD of claim 51, wherein the dynamic routing multiplexer comprises a clock input terminal, the PLD further comprising:
 a memory cell; and
 a clock multiplexer having an output terminal coupled to the clock input terminal of the dynamic routing multiplexer, a first data input terminal coupled to receive a first clock signal, a second data input terminal coupled to receive a second clock signal, and a select terminal coupled to the memory cell.

54. The PLD of claim 53, wherein the PLD comprises a field programmable gate array (FPGA), and the memory cell comprises a configuration memory cell of the FPGA.

55. The PLD of claim 31, wherein the interconnect structure comprises a plurality of routing multiplexers coupled into pairs configured and arranged to pass paired true and complement output signals.

56. The PLD of claim 55, further comprising, for each pair of the routing multiplexers:
 a plurality of memory cells, each memory cell being coupled to each of the routing multiplexers in the pair of routing multiplexers.

57. The PLD of claim 56, wherein the PLD comprises a field programmable gate array (FPGA), and the memory cells comprise configuration memory cells of the FPGA.

58. The PLD of claim 55, wherein each of the routing multiplexers is configured and arranged to provide a dynamic output signal pre-charged to the first known value.

59. The PLD of claim 55, wherein each of the routing multiplexers is configured and arranged to provide a static output signal.

60. A programmable logic device (PLD), comprising:
 a plurality of dynamic lookup table (LUT) circuits, each dynamic LUT circuit comprising a plurality of paired true and complement input terminals and a pair of true and complement output terminals, each of the true and complement output terminals being configured and arranged to provide a dynamic output signal pre-charged to a first known value, each of the dynamic LUT circuits having a clock input terminal;
 an interconnect structure comprising a plurality of dynamic routing multiplexers programmably interconnecting the dynamic LUT circuits one to another via the true and complement input terminals and the true and complement output terminals of the dynamic LUT circuits, each dynamic routing multiplexer having a clock input terminal and further having an output terminal configured and arranged to provide a dynamic output signal pre-charged to the first known value;
 a plurality of first memory cells; and
 a plurality of clock multiplexers each having an output terminal coupled to the clock input terminal of an associated one of the dynamic LUT circuits and the dynamic routing multiplexers, a first data input terminal coupled to receive a first clock signal, a second data input terminal coupled to receive a second clock signal, and a select terminal coupled to an associated one of the first memory cells.

61. The PLD of claim 60, wherein the first known value is a high value.

62. The PLD of claim 60, further comprising a plurality of flip-flops, each flip-flop being programmably coupled between one of the true and complement output terminals of a corresponding dynamic LUT circuit and the interconnect structure.

63. The PLD of claim 60, wherein the plurality of paired true and complement input terminals comprises six true input terminals and six complement input terminals.

64. The PLD of claim 60, wherein the PLD comprises a field programmable gate array (FPGA), and the first memory cells comprise configuration memory cells of the FPGA.

65. The PLD of claim 60, wherein the dynamic routing multiplexers are coupled into pairs configured and arranged to pass paired true and complement output signals.

66. The PLD of claim 65, further comprising, for each pair of the dynamic routing multiplexers:
 a plurality of second memory cells, each second memory cell being coupled to each of the dynamic routing multiplexers in the pair of dynamic routing multiplexers.

67. The PLD of claim 66, wherein the PLD comprises a field programmable gate array (FPGA), and the second memory cells comprise configuration memory cells of the FPGA.

68. The PLD of claim 65, wherein each of the dynamic routing multiplexers is configured and arranged to provide a dynamic output signal pre-charged to the first known value.

69. The PLD of claim 60, wherein each of the dynamic routing multiplexers comprises skewed logic configured and arranged to pass a change in value from the first known value to a second known value more quickly than a change in value from the second known value to the first known value.

70. The PLD of claim 69, wherein the first known value is a high value and the second known value is a low value.

71. The PLD of claim 60, wherein each of the dynamic LUT circuits comprises skewed logic configured and arranged to pass a change in value from the first known value to a second known value more quickly than a change in value from the second known value to the first known value.

72. The PLD of claim 71, wherein the first known value is a high value and the second known value is a low value.

73. A self-resetting lookup table (LUT) circuit, comprising:
 a plurality of LUT input terminals comprising a plurality of paired true and complement input terminals;
 a memory array comprising a plurality of bitlines, a plurality of input terminals coupled to the LUT input terminals, and a plurality of output terminals;
 a pre-charge generator circuit having a plurality of input terminals coupled to the LUT input terminals and further having a pre-charge output terminal;

a bitline pre-charge circuit coupled to the bitlines, the bitline pre-charge circuit having a pre-charge input terminal coupled to the pre-charge output terminal of the pre-charge generator circuit and further having a reset input terminal; and an output circuit having a plurality of input terminals coupled to the output terminals of the memory array, true and complement output terminals each configured and arranged to provide a dynamic output signal pre-charged to a first known value, and a reset output terminal coupled to the reset input terminal of the bitline pre-charge circuit.

74. The self-resetting LUT circuit of claim 73, wherein the first known value is a high value.

75. The self-resetting LUT circuit of claim 73, wherein:
the plurality of paired true and complement input terminals comprises six true input terminals and six complement input terminals, and
four of the true input terminals and four of the complement input terminals are coupled to the input terminals of the pre-charge generator circuit.

76. The self-resetting LUT circuit of claim 73, wherein the self-resetting LUT circuit forms a portion of a programmable logic device (PLD).

77. The self-resetting LUT circuit of claim 76, wherein the PLD comprises a field programmable gate array (FPGA).

78. The self-resetting LUT circuit of claim 73, wherein the output circuit comprises an exclusive OR gate having input terminals coupled to the true and complement output terminals of the output circuit and further having an output terminal coupled to the reset output terminal of the output circuit.

79. The self-resetting LUT circuit of claim 73, further comprising:
a decoder circuit coupled between the LUT input terminals and the memory array, the decoder circuit comprising a decoder interface circuit coupled to the LUT input terminals and a decoder coupled between the decoder interface circuit and the memory array,
wherein the decoder interface circuit comprises a plurality of latches coupled between the LUT input terminals and the input terminals of the decoder, each of the latches having a reset input terminal coupled to the reset output terminal of the output circuit.

80. The self-resetting LUT circuit of claim 73, wherein:
the memory array further comprises an array of memory cells coupled to the bitlines and a read multiplexer coupled between the bitlines and the output terminals of the memory array;
the decoder circuit is configured and arranged to more slowly pass first input signals from a first plurality of input terminals, and is further configured and arranged to more quickly pass second input signals from a second plurality of input terminals;
the decoder circuit is configured and arranged to provide from the first input signals a plurality of first decoded signals to the array of memory cells; and
the decoder circuit is further configured and arranged to provide from the second input signals a plurality of second decoded signals to the read multiplexer.

81. The self-resetting LUT circuit of claim 80, wherein the first plurality of input terminals of the decoder circuit comprise eight paired true and complement input terminals and the second plurality of input terminals of the decoder circuit comprise four paired true and complement input terminals.

82. The self-resetting LUT circuit of claim 80, wherein the read multiplexer comprises two paired output terminals configured and arranged to provide signals derived from two paired ones of the bitlines.

83. The self-resetting LUT circuit of claim 73, further comprising:
a read logic circuit coupled between the output terminals of the memory array and the input terminals of the output circuit, the read logic circuit having a pre-charge input terminal coupled to the pre-charge output terminal of the pre-charge generator circuit and further having a reset input terminal coupled to the reset output terminal of the output circuit.

84. The self-resetting LUT circuit of claim 73, wherein the pre-charge generator circuit comprises skewed logic configured and arranged to pass a change in value on the LUT input terminals from the first known value to a second known value more quickly than a change in value from the second known value to the first known value.

85. The self-resetting LUT circuit of claim 84, wherein the first known value is a high value and the second known value is a low value.

86. The self-resetting LUT circuit of claim 73, wherein the output circuit comprises skewed logic configured and arranged to provide a change in value on the LUT output terminals from the first known value to a second known value more quickly than a change in value from the second known value to the first known value.

87. The self-resetting LUT circuit of claim 86, wherein the first known value is a high value and the second known value is a low value.

88. The self-resetting LUT circuit of claim 73, wherein:
the self-resetting LUT circuit further comprises a decoder circuit coupled between the LUT input terminals and the memory array, and
the decoder circuit comprises skewed logic configured and arranged to pass a change in value on the LUT input terminals from the first known value to a second known value more quickly than a change in value from the second known value to the first known value.

89. The self-resetting LUT circuit of claim 88, wherein the first known value is a high value and the second known value is a low value.

90. A programmable circuit, comprising:
a true output terminal;
a complement output terminal;
a first plurality of pass transistors each having a first data terminal, a second data terminal coupled to the true output terminal, and a gate terminal;
a second plurality of pass transistors each having a first data terminal, a second data terminal coupled to the complement output terminal, and a gate terminal;
a plurality of memory cells, each memory cell being coupled to the gate terminal of one of the first plurality of pass transistors and further being coupled to the gate terminal of a corresponding one of the second plurality of pass transistors; and
a first output buffer having an input terminal coupled to the true output terminal and a second output buffer having an input terminal coupled to the complement output terminal.

91. The programmable circuit of claim 90, wherein each of the first and second output buffers comprises skewed logic configured and arranged to pass a change in value from a first known value to a second known value more quickly than a change in value from the second known value to the first known value.

92. The programmable circuit of claim 91, wherein the first known value is a high value and the second known value is a low value.

93. The programmable circuit of claim 90, wherein:
the first output buffer comprises a first pullup coupled to an output terminal of the first output buffer;
the second output buffer comprises a second pullup coupled to an output terminal of the first output buffer; and
each of the first and second pullups comprises a gate terminal coupled to a common clock input terminal.

94. The programmable circuit of claim 93, wherein each of the first and second output buffers comprises skewed logic configured and arranged to pass a change in value from a high value to a low value more quickly than a change in value from the low value to the high value.

95. The programmable circuit of claim 90, wherein the programmable circuit comprises a portion of an interconnect structure in a programmable logic device (PLD).

96. The programmable circuit of claim 95, wherein the PLD comprises a field programmable gate array (FPGA), and the memory cells comprise configuration memory cells of the FPGA.

\* \* \* \* \*